(12) United States Patent
Kim et al.

(10) Patent No.: US 10,976,628 B2
(45) Date of Patent: Apr. 13, 2021

(54) DISPLAY DEVICE

(71) Applicant: Samsung Display Co., Ltd., Yongin-si (KR)

(72) Inventors: Kyung Ho Kim, Seongnam-si (KR); Byoung Sun Na, Seoul (KR); Seong Young Lee, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 6 days.

(21) Appl. No.: 16/236,937

(22) Filed: Dec. 31, 2018

(65) Prior Publication Data

US 2020/0004069 A1    Jan. 2, 2020

(30) Foreign Application Priority Data

Jun. 27, 2018 (KR) .................. 10-2018-0074178

(51) Int. Cl.
*H01L 27/12* (2006.01)
*G02F 1/1368* (2006.01)
(Continued)

(52) U.S. Cl.
CPC ...... *G02F 1/1368* (2013.01); *G02F 1/134309* (2013.01); *G02F 1/136286* (2013.01);
(Continued)

(58) Field of Classification Search
CPC ............. G02F 1/1368; G02F 1/134309; G02F 1/136286; G02F 1/136227;
(Continued)

(56) References Cited

U.S. PATENT DOCUMENTS

2010/0032677 A1* 2/2010 Lee ................ G09G 3/3648
257/71
2015/0144941 A1  5/2015 Kano et al.
(Continued)

FOREIGN PATENT DOCUMENTS

EP      3229068        10/2017
WO    2017185944      11/2017

OTHER PUBLICATIONS

Extended European Search Report dated Jul. 22, 2019, in European Application No. 19163625.7.

*Primary Examiner* — Cuong B Nguyen
(74) *Attorney, Agent, or Firm* — H.C. Park & Associates, PLC

(57) ABSTRACT

A display device includes: a gate line (GL); a semiconductor pattern (SP) on the GL; a data line (DL); a voltage division reference line (VDRL); and first to third switching elements (SWE) overlapping the SP. The first SWE includes a first source electrode (SE) connected to the DL, a first drain electrode (DE) spaced apart from the first SE, and a first gate electrode (GE) connected to the GL. The second SWE includes a second SE connected to the DL, a second DE spaced apart from the second SE, and a second GE connected to the GL. The third SWE includes a third SE connected to the VDRL, a third DE connected to the second SE, and a third GE connected to the GL. The first SE, the first DE, the second SE, and the second DE are sequentially arranged across and on the SP in a first direction.

34 Claims, 16 Drawing Sheets

(51) Int. Cl.
*G02F 1/1343* (2006.01)
*G02F 1/1362* (2006.01)

(52) U.S. Cl.
CPC .... H01L 27/1222 (2013.01); *G02F 1/136227* (2013.01); *G02F 2001/134345* (2013.01); *G02F 2001/136218* (2013.01); *G02F 2001/136222* (2013.01); *G02F 2201/122* (2013.01); *G02F 2201/123* (2013.01); *G02F 2201/40* (2013.01)

(58) Field of Classification Search
CPC ........ G02F 2001/134345; G02F 2001/136218; G02F 2001/136222; G02F 1/13624; G02F 2201/122; G02F 2201/123; G02F 2201/40; H01L 27/1222; H01L 27/124; H01L 27/1214
See application file for complete search history.

(56) References Cited

U.S. PATENT DOCUMENTS

| | | | |
|---|---|---|---|
| 2016/0320683 A1 | 11/2016 | Ahn et al. | |
| 2017/0010508 A1 | 1/2017 | Jung | |
| 2017/0059947 A1* | 3/2017 | Kim | G02F 1/133707 |
| 2017/0160583 A1* | 6/2017 | Baek | G02F 1/133512 |
| 2018/0203311 A1 | 7/2018 | Long et al. | |

* cited by examiner

DISPLAY DEVICE

CROSS-REFERENCE TO RELATED APPLICATION

This application claims priority from and the benefit of Korean Patent Application No. 10-2018-0074178, filed Jun. 27, 2018, which is hereby incorporated by reference for all purposes as if fully set forth herein.

BACKGROUND

Field

Exemplary embodiments generally relate to display technology, and more particularly, to a display device.

Discussion

Among display devices, a liquid crystal display device is one of the most widely used display devices. A conventional liquid crystal display device typically includes two substrates provided with electric field generation electrodes, such as a pixel electrode and a common electrode, and a liquid crystal layer disposed the two substrates. A voltage may be applied to the electric field generation electrodes to generate an electric field in the liquid crystal layer, and thus, alignment of liquid crystal molecules in the liquid crystal layer is determined, and the polarization of incident light is controlled, thereby displaying an image.

Among liquid crystal display devices, a vertically aligned type liquid crystal display device where major axes of liquid crystal molecules are aligned in a direction perpendicular to upper and lower substrates in a state in which an electric field is not applied has been spotlighted because it has a large contrast ratio and easily realizes a wide reference viewing angle. The vertically aligned type liquid crystal display device may, however, have poor side visibility as compared with front visibility. To address this issue, a method of dividing one pixel into two sub-pixels and controlling the voltages of the two sub-pixels differently to vary transmittance has been proposed. The voltage ratio between two sub-pixels in one pixel can influence the transmittance of the liquid crystal display device that can, in turn, influence the display quality of the liquid crystal display device. Therefore, to have uniform display quality, the voltage ratio between sub-pixels of each pixel should be constant.

The above information disclosed in this section is only for understanding the background of the inventive concepts, and, therefore, may contain information that does not form prior art.

SUMMARY

Some exemplary embodiments are capable of provide a display device having uniform display quality.

Additional aspects will be set forth in the detailed description which follows, and, in part, will be apparent from the disclosure, or may be learned by practice of the inventive concepts.

According to some exemplary embodiments, a display device includes a gate line, a semiconductor pattern, a data line, a voltage division reference line, first to third switching elements, a first sub-pixel electrode, and a second sub-pixel electrode. The semiconductor pattern is disposed on the gate line. The data line is insulated from the gate line. The data line intersects the gate line. The voltage division reference line is insulated from the gate line. The voltage division reference line intersects the semiconductor pattern. The first switching element overlaps the semiconductor pattern. The first switching element includes a first source electrode electrically connected to the data line, a first drain electrode spaced apart from the first source electrode, and a first gate electrode electrically connected to the gate line. The second switching element overlaps the semiconductor pattern. The second switching element includes a second source electrode electrically connected to the data line, a second drain electrode spaced apart from the second source electrode, and a second gate electrode electrically connected to the gate line. The third switching element overlaps the semiconductor pattern. The third switching element includes a third source electrode electrically connected to the voltage division reference line, a third drain electrode electrically connected to the second source electrode, and a third gate electrode electrically connected to the gate line. The first sub-pixel electrode is electrically connected to the first drain electrode. The second sub-pixel electrode is electrically connected to the second drain electrode. The first source electrode, the first drain electrode, the second source electrode, and the second drain electrode are arranged across the semiconductor pattern and are sequentially arranged in a first direction on the semiconductor pattern.

According to some exemplary embodiments, a display device includes a gate line, a semiconductor pattern, a data line, a voltage division reference line, first to fourth electrode lines, first to third switching elements, a first sub-pixel electrode, and a second sub-pixel electrode. The semiconductor pattern is disposed on the gate line. The data line is insulated from the gate line. The data line intersects the gate line. The voltage division reference line is insulated from the gate line. The voltage division reference line intersects the semiconductor pattern. The first to fourth electrode lines are sequentially arranged along a first direction and respectively intersect the semiconductor pattern. The first switching element includes: a first source electrode electrically connected to the data line, the first electrode line, and the third electrode line; a first drain electrode electrically connected to the second electrode line, and a first gate electrode electrically connected to the gate line. The second switching element includes a second source electrode electrically connected to the data line and the third electrode line, a second drain electrode electrically connected to the fourth electrode line, and a second gate electrode electrically connected to the gate line. The third switching element includes a third source electrode electrically connected to the fourth electrode line, a third drain electrode electrically connected to the voltage division reference line, and a third gate electrode electrically connected to the gate line. The first sub-pixel electrode is electrically connected to the first drain electrode. The second sub-pixel electrode is electrically connected to the second drain electrode. A width of the semiconductor pattern in a second direction between the fourth electrode line and the voltage division reference line is smaller than a width of the semiconductor pattern in a second direction between the third electrode line and the fourth electrode line. The second direction is perpendicular to the first direction.

According to some exemplary embodiments, a display device includes a semiconductor pattern and a plurality of conductive patterns. The semiconductor pattern is disposed in a pixel. The semiconductor pattern has a first width in a first direction and a second width in a second direction crossing the first direction. The plurality of conductive patterns is disposed along the second width of the semiconductor pattern and is located on the same layer as one another. The plurality of conductive patterns traverse the semiconductor pattern in the first direction. The plurality of conductive patterns include a first conductive pattern, a second conductive pattern, a third conductive pattern, and a fourth conductive pattern that are sequentially arranged and spaced apart from one another in the second direction. The first width of the semiconductor pattern in the first direction is uniform from the second conductive pattern to the fourth conductive pattern.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
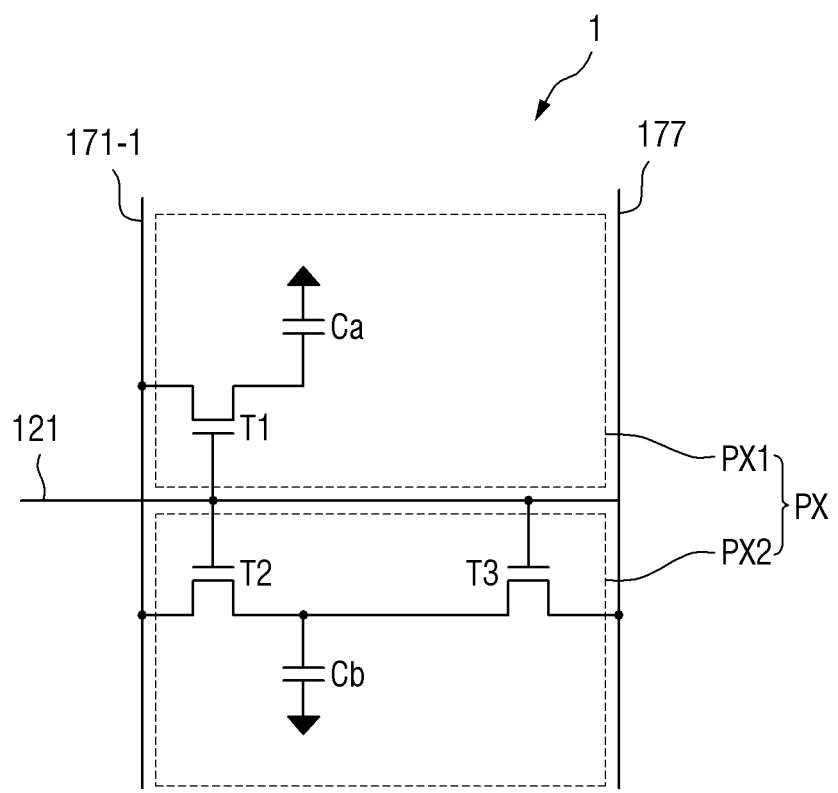
FIG. 1 is a circuit diagram of a pixel of a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. Further, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to cross-sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, various exemplary embodiments will be explained in detail with reference to the accompanying drawings FIG. 1 is a circuit diagram of a pixel of a display device according to some exemplary embodiments.

Referring to FIG. 1, a display device 1 includes a gate line 121, a first data line 171-1, a voltage division reference line 177, and a pixel PX.

The pixel PX may be connected to the gate line 121, the first data line 171-1, and the voltage division reference line 177. The gate line 121 may transmit a gate signal to the pixel PX. The first data line 171-1 may transmit a data signal (or a data voltage) to the pixel PX. A predetermined reference voltage (or a reference voltage for voltage division) may be applied to the voltage division reference line 177.

The pixel PX may include a first sub-pixel PX1 and a second sub-pixel PX2.

The first sub-pixel PX1 may include a first switching element T1 and a first liquid crystal capacitor Ca, and the second sub-pixel PX2 may include a second switching element T2, a second liquid crystal capacitor Cb, and a third switching element T3.

Each of the first switching element T1, the second switching element T2, and the third switching element T3 may be a thin film transistor.

The first switching element T1 may include a first electrode (or a first source electrode) connected to the first data line 171-1, a second electrode (or a first drain electrode) connected to the first liquid crystal capacitor Ca, and a gate electrode (or a first gate electrode) connected to the gate line 121. The second electrode of the first switching element T1 may be connected to the first sub-pixel electrode constituting the first liquid crystal capacitor Ca.

The second switching element T2 may include a first electrode (or a second source electrode) connected to the first data line 171-1, a second electrode (or a second drain electrode) connected to the second liquid crystal capacitor Cb, and a gate electrode (or a second gate electrode) connected to the gate line 121. The second electrode of the second switching element T2 may be connected to the second sub-pixel electrode constituting the second liquid crystal capacitor Cb.

The third switching element T3 may include a first electrode (or a third source electrode) connected to the second liquid crystal capacitor Cb, a second electrode (or a third drain electrode) connected to the voltage division reference line 177, and a gate electrode (or a third gate electrode) connected to the gate line 121. A reference voltage for voltage division may be applied to the second electrode of the third switching element T3 through the voltage division reference line 177.

The first liquid crystal capacitor Ca and the second liquid crystal capacitor Cb may be connected to a common electrode. A common voltage may be applied to the common electrode.

When a gate-on voltage is applied to the gate line 121, each of the first switching element T1, the second switching element T2, and the third switching element T3 may be turned on, and the first liquid crystal capacitor Ca and the second liquid crystal capacitor Cb may be charged by a data voltage transmitted through the first data line 171-1. Here, data voltages applied to the first sub-pixel electrode and the second sub-pixel electrode may be the same as each other. The first liquid crystal capacitor Ca may be charged corresponding to a difference between a common voltage and a data voltage, and the second liquid crystal capacitor Cb may be charged corresponding to a difference between a data voltage divided by the third switching element T3 and a common voltage.

Since the third switching element T3 is connected in series to the second switching element T2, when the third switching element T3 is turned on, the data voltage transmitted to the second sub-pixel PX2 may be divided (or distributed) to the second switching element T2 and the third switching element T3. The data voltage may be distributed based on the size (or capacitance) of a channel of the second switching element T2 and the size of a channel of the third switching element T3. Accordingly, even if the data voltages transmitted to the first sub-pixel PX1 and the second sub-pixel PX2 through the first data line 171-1 are the same as each other, the voltages charged in the first liquid crystal capacitor Ca and the second liquid crystal capacitor Cb may be different from each other. For example, the voltage charged in the second liquid crystal capacitor Cb may be lower than the voltage charged in the first liquid crystal capacitor Ca. In this case, the side visibility of the display device 1 may be improved.

The voltage level of the reference voltage applied to the second electrode of the third switching element T3 may be equal to or higher than the voltage level of the common voltage applied to the common electrode. For example, when the common voltage is about 7V, the reference voltage applied to the second electrode of the third switching element T3 may be about 8V to 11V, but exemplary embodiments are not limited thereto.

Figure 2:
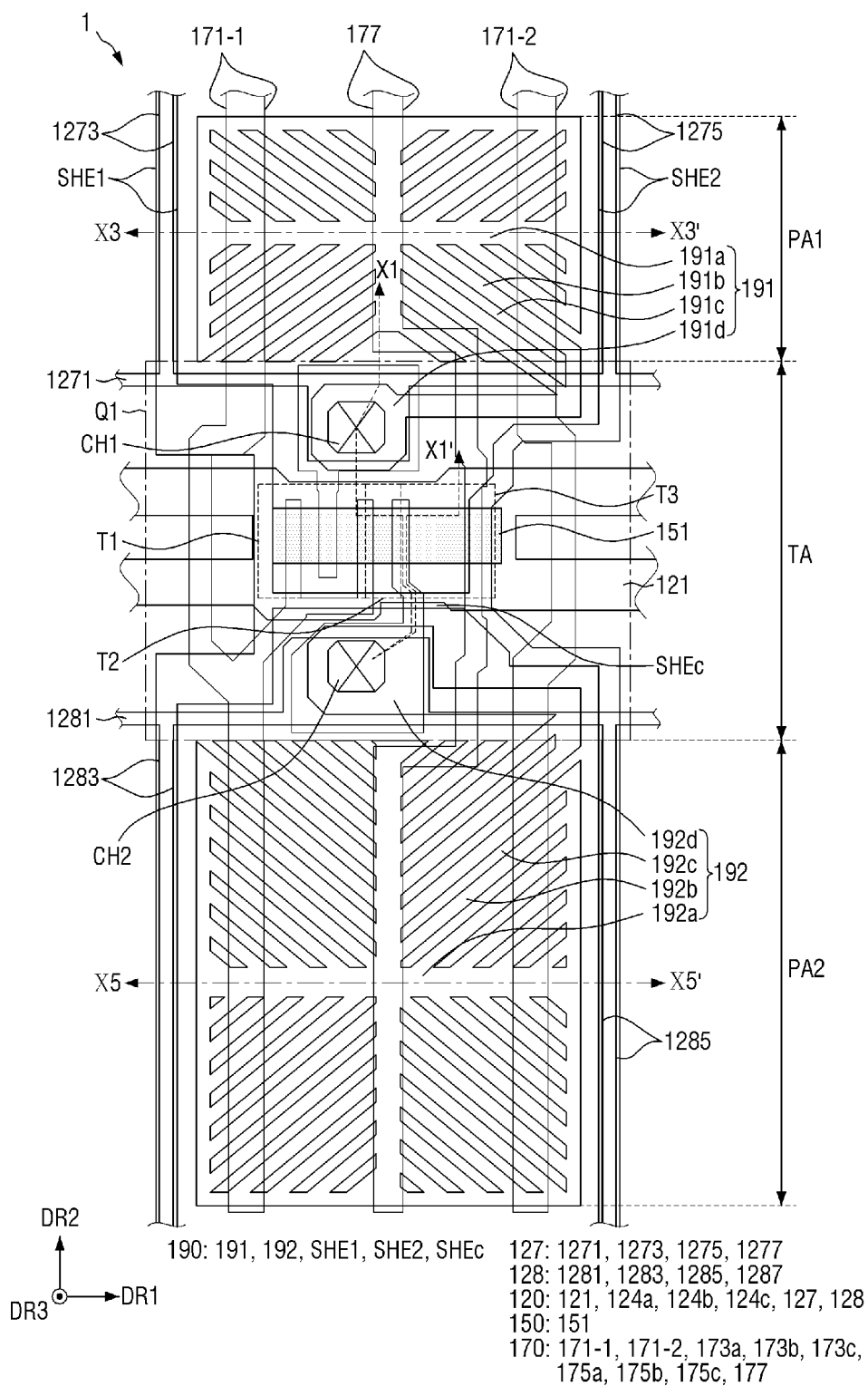
FIG. 2 is a layout view showing an example of a pixel of the display device of FIG. 1 according to some exemplary embodiments.
Figure 3:
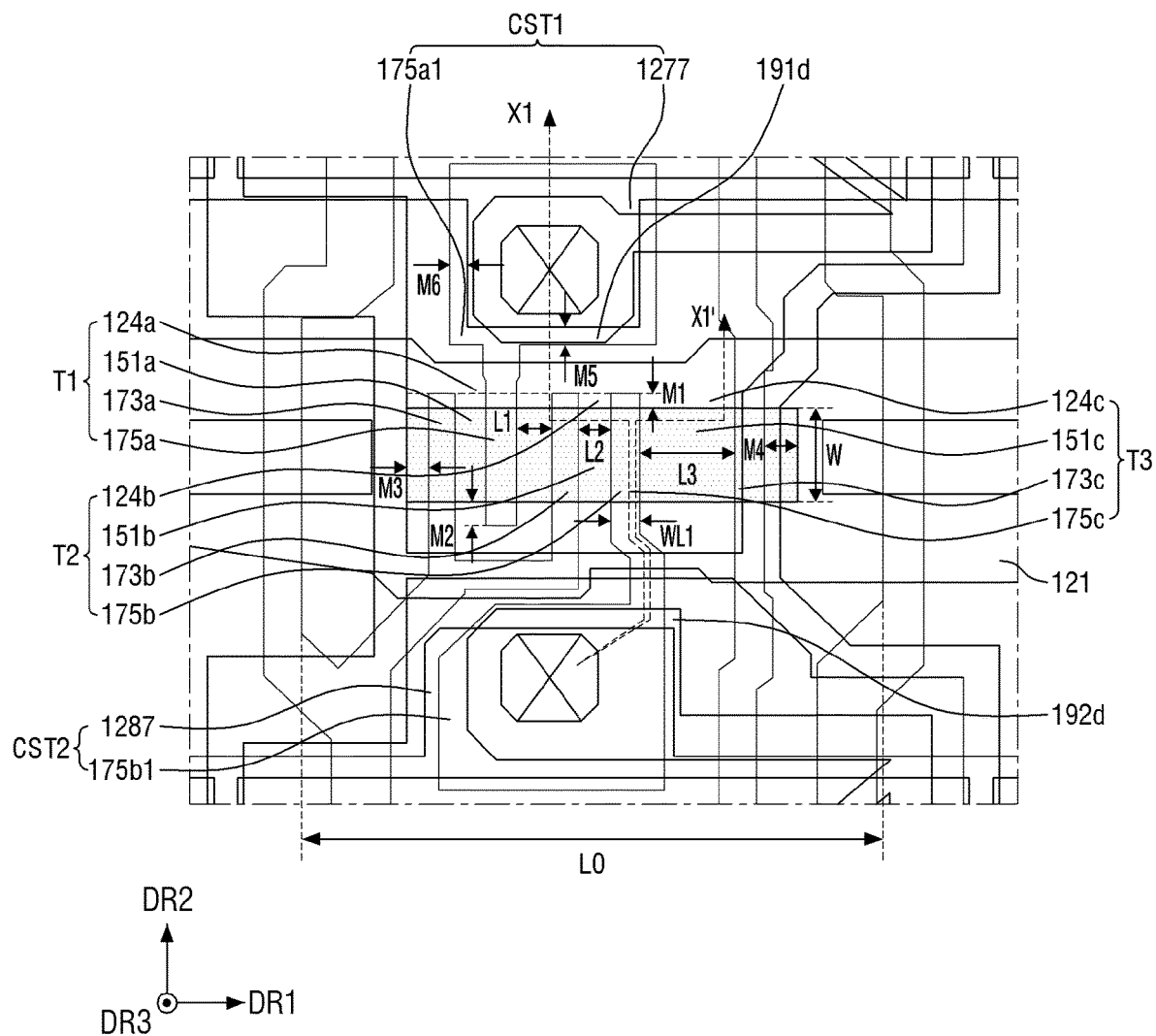
FIG. 3 is an enlarged view of the area Q1 in FIG. 2 according to some exemplary embodiments.
Figure 4:
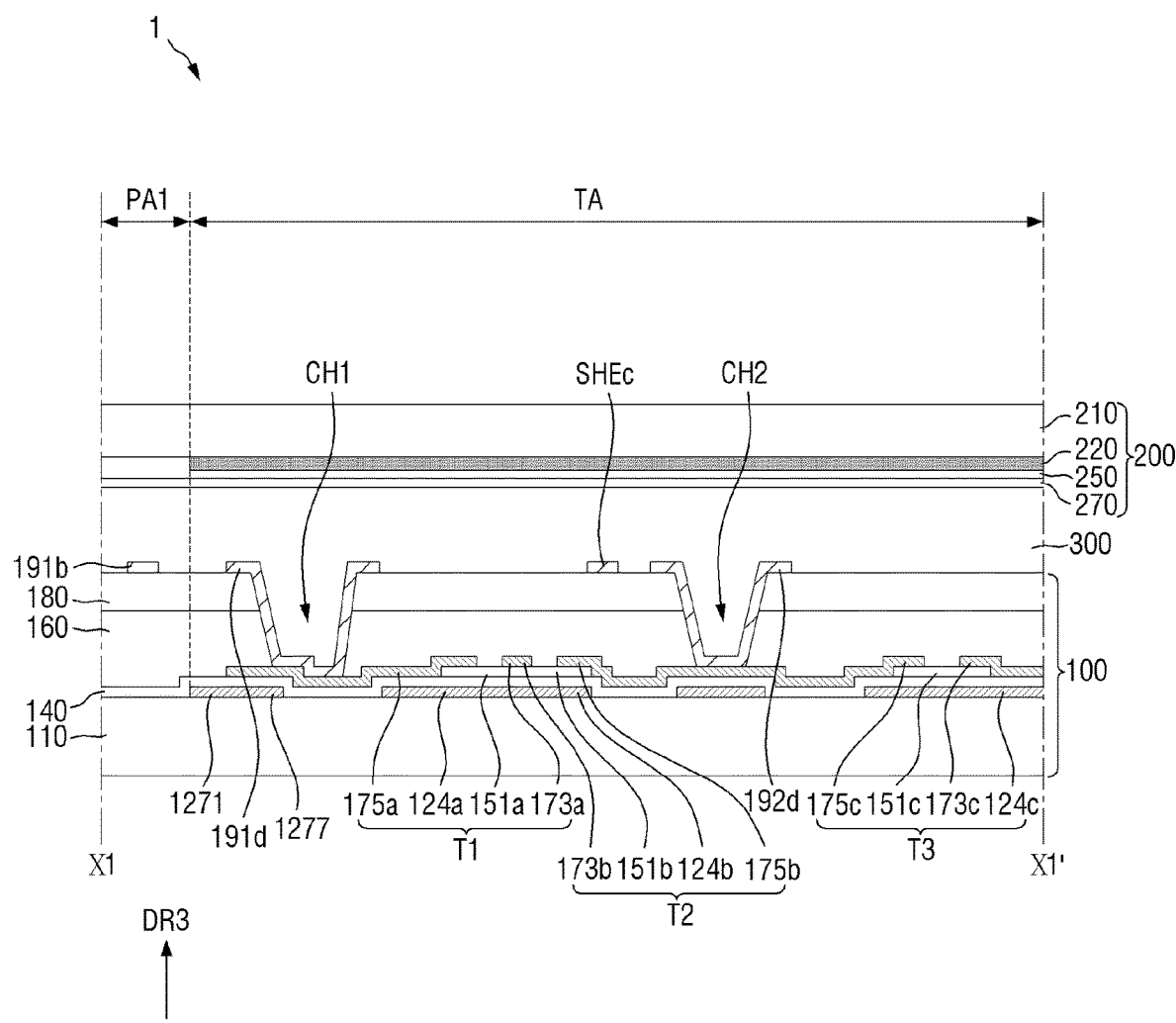
FIG. 4 is a cross-sectional view taken along sectional line X1-X1' in FIG. 2 according to some exemplary embodiments.
Figure 5:
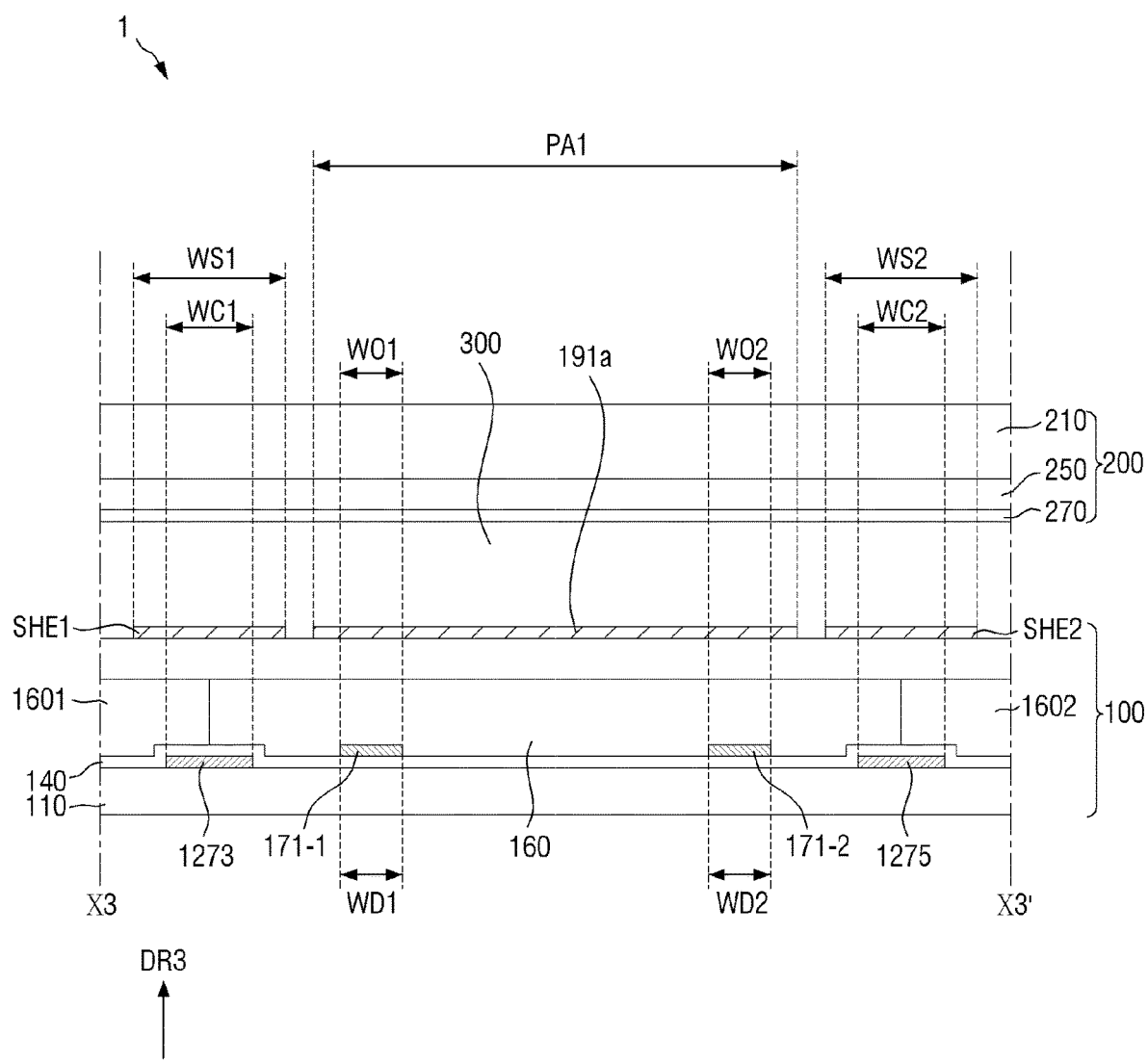
FIG. 5 is a cross-sectional view taken along sectional line X3-X3' in FIG. 2 according to some exemplary embodiments.
Figure 6:
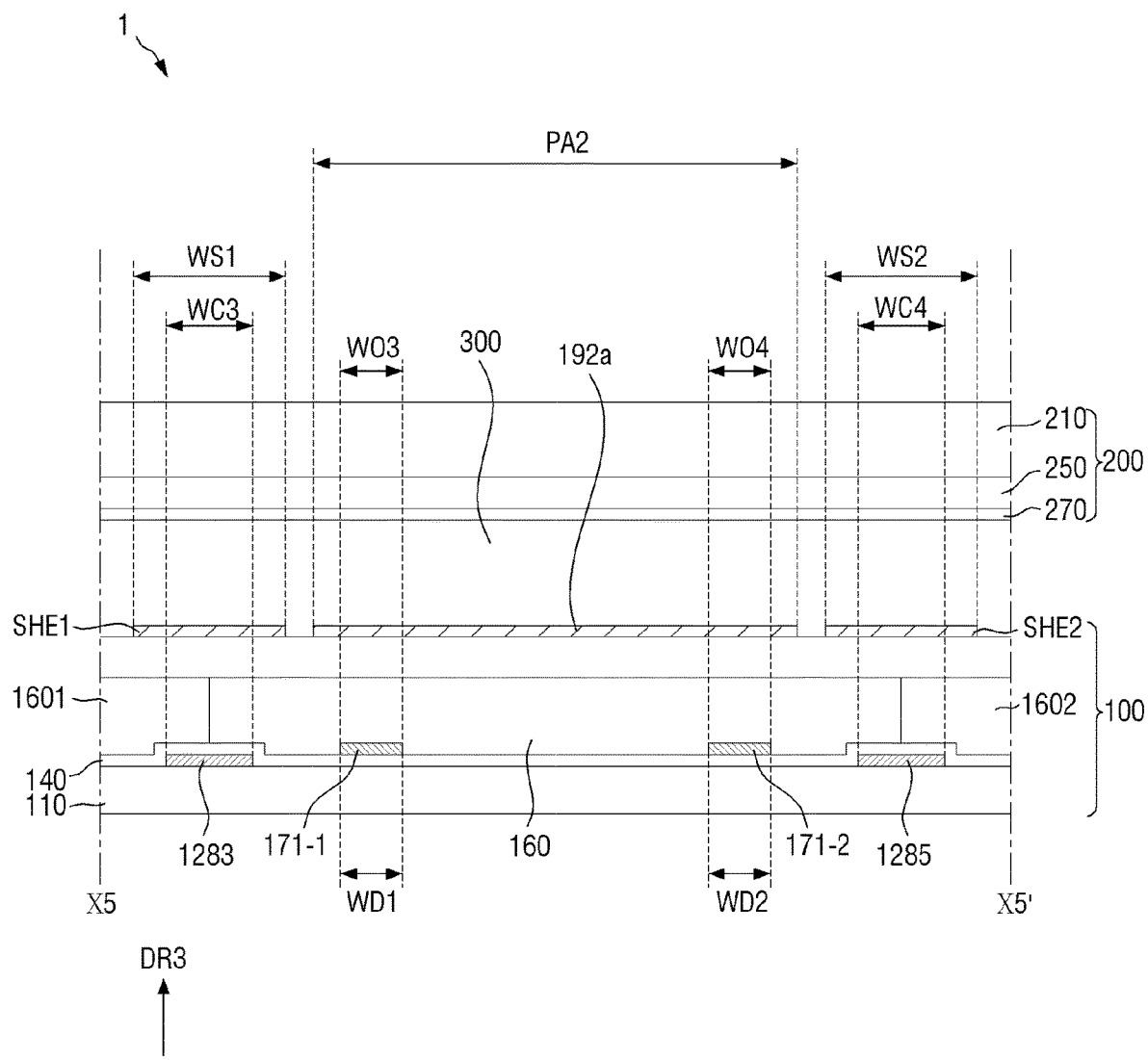
FIG. 6 is a cross-sectional view taken along sectional line X5-X5' in FIG. 2 according to some exemplary embodiments.

FIG. 2 is a layout view showing an example of a pixel of the display device of FIG. 1 according to some exemplary embodiments. FIG. 3 is an enlarged view of the area Q1 in FIG. 2 according to some exemplary embodiments. FIG. 4 is a cross-sectional view taken along sectional line X1-X1' in FIG. 2 according to some exemplary embodiments. FIG. 5 is a cross-sectional view taken along sectional line X3-X3' in FIG. 2 according to some exemplary embodiments. FIG. 6 is a cross-sectional view taken along sectional line X5-X5' in FIG. 2 according to some exemplary embodiments.

Referring to FIGS. 2 to 6, a display device 1 according to some exemplary embodiments may include a first substrate 100, a second substrate 200, and a liquid crystal layer 300. The second substrate 200 may face the first substrate 100, and the liquid crystal layer 300 may be disposed between the first substrate 100 and the second substrate 200.

The first substrate 100 may be a thin film transistor array substrate provided with first, second, and third switching elements T1, T2, and T3. The second substrate 200 may be a substrate facing the first substrate 100.

The liquid crystal layer 300 may include liquid crystal molecules having dielectric anisotropy. When an electric field is applied between the first substrate 100 and the second substrate 200, the liquid crystal molecules are rotated in a specific (or determined) direction between the first substrate 100 and the second substrate 200, thereby adjusting the phase delay value of light passing through the liquid crystal layer 300. The amount of polarized light (for example, light having passed through a lower polarization member) passing through an upper polarization member (disposed at a light emission side, for example, may be attached to the outer surface of the second substrate 200) may be changed depending on how much the phase delay value is varied by the rotation of the liquid crystal molecules, thereby controlling transmittance.

Hereinafter, the first substrate 100 will be described in more detail.

The first substrate 100 includes a first base substrate 110, a first conductive layer 120, a gate insulating layer 140, a semiconductor layer 150, a second conductive layer 170, an organic layer 180, and a third conductive layer 190. The first substrate 100 may further include a color filter 160.

The first base substrate 110 may be made of an insulating material, such as glass, quartz, or a polymer resin. Examples of the polymer resin may include at least one of polyethersulfone (PES), polyacrylate (PA), polyarylate (PAR), polyetherimide (PEI), polyethylene naphthalate (PEN), polyphenylene sulfide (PPS), polyallylate, polyimide (PI), polycarbonate (PC), cellulose triacetate (CAT), cellulose acetate propionate (CAP), and a combination thereof. The first base substrate 110 may also include a metallic material.

A first sub-pixel area PA1, a second sub-pixel area PA2, and a switching element area TA may be defined on the first base substrate 110. The first sub-pixel area PA1 may be defined as an area where a first stem portion 191a and a first branch portion 191b of a first sub-pixel electrode 191 to be described later are disposed, and the second sub-pixel area PA2 may be defined as an area where a second stem portion 192a and a second branch portion 192b of a second sub-pixel electrode 192 to be described later are disposed. The switching element area TA may be defined as an area where the first switching element T1, the second switching element T2, and the third switching element T3 are arranged. The switching element area TA may be located between the first sub-pixel area PA1 and the second sub-pixel area PA2.

The first conductive layer 120 may be located or disposed on the first base substrate 110. The first conductive layer 120 may include a gate line 121, a first gate electrode 124a, a second gate electrode 124b, and a third gate electrode 124c. The gate line 121, the first gate electrode 124a, the second gate electrode 124b, and the third gate electrode 124c may be located on the same layer and made of the same material. Hereinafter, the meaning of being located on the same layer means that the layers located immediately under each structure are the same, or that each structure is located at the same level.

The gate line 121 may extend along the first direction DR1.

The first gate electrode 124a, the second gate electrode 124b, and the third gate electrode 124c may be electrically connected to the gate line 121. Hereinafter, the meaning of being connected refers to a case where two components are physically connected to each other or a case where two components are in physical contact with each other. Further, the meaning of being electrically connected refers to not only a case where two components are physically connected to each other, but also a case where two components are electrically connected to each other though other conductors even if they are not physically connected to each other.

The first gate electrode 124a, the second gate electrode 124b, and the third gate electrode 124c may be connected to each other, but exemplary embodiments are not limited thereto.

The first conductive layer 120 may include at least one metal selected from molybdenum (Mo), aluminum (Al), platinum (Pt), palladium (Pd), silver (Ag), magnesium (Mg), gold (Au), neodymium (Nd), iridium (Ir), chromium (Cr), titanium (Ti), tantalum (Ta), tungsten (W), and copper (Cu). The first conductive layer 120 may be a single-layer film or a multilayer film.

The gate insulating layer 140 may be disposed on the first conductive layer 120. The gate insulating layer 140 may include an inorganic insulating material, such as a silicon compound or a metal oxide. For example, the gate insulating layer 140 may include at least one of silicon oxide, silicon nitride, silicon oxynitride, aluminum oxide, tantalum oxide, hafnium oxide, zirconium oxide, titanium oxide, or a combination thereof. The gate insulating layer 140 may be a single-layer film or a multilayer film formed of a laminate film of different materials.

The semiconductor layer 150 may be disposed on the gate insulating layer 140. The semiconductor layer 150 may include a first semiconductor pattern 151, and the first semiconductor pattern 151 may include a first semiconductor region 151a, a second semiconductor region 151b, and a third semiconductor region 151c.

The first semiconductor region 151a may overlap the first gate electrode 124a, the second semiconductor region 151b may overlap the second gate electrode 124b, and the third semiconductor region 151c may overlap the third gate electrode 124c. Each of the first semiconductor region 151a, the second semiconductor region 151b, and the third semiconductor region 151c may be a region (or a channel region) where the conductivity between a source electrode and a drain electrode is reversed to form a channel when an electric field is applied by an overlapping gate electrode.

As shown in FIG. 3, the first semiconductor pattern 151 is composed of one pattern. The first semiconductor region 151a, the second semiconductor region 151b, and the third semiconductor region 151c may be sequentially disposed, and may be connected to each other.

In some exemplary embodiments, the semiconductor layer 150 may include a silicon-based semiconductor material, such as amorphous silicon, polycrystalline silicon, or monocrystalline silicon. In some exemplary embodiments, the semiconductor layer 150 may include monocrystalline silicon, low-temperature polycrystalline silicon, or amorphous silicon. However, exemplary embodiments are not limited thereto, and the semiconductor layer 150 may include an oxide semiconductor. For example, the semiconductor layer 150 may include a two-component compound (ABx), a three-component compound (ABxCy), or a four-component compound (ABxCyDz) that contains two or more selected from indium, zinc, gallium, tin, titanium, aluminum, hafnium (Hf), zirconium (Zr), and magnesium (Mg). The semiconductor layer 150 may include ITZO (an oxide including indium, tin, and titanium) or IGZO (an oxide including indium, gallium, and tin).

In some exemplary embodiments, the width of the semiconductor layer 150 in the second direction DR2 may be constant along the first direction DR1. Here, the second direction DR2 may intersect the first direction DR1, for example, the second direction DR2 may be perpendicular to the first direction DR1. That is, the width of the first semiconductor region 151a in the second direction DR2, the width of the second semiconductor region 151b in the second direction DR2, and the width of the third semiconductor region 151c in the second direction DR2 may be equal to each other.

The second conductive layer 170 may be disposed on the gate insulating layer 140 and the semiconductor layer 150.

The second conductive layer 170 may be formed using a mask different from a mask for forming the semiconductor layer 150. Accordingly, a part of the second conductive layer 170 may be in direct contact with the gate insulating layer 140. Further, another part of the second conductive layer 170 may be disposed on the semiconductor layer 150, and may be in contact with a side surface of at least one (for example, the first semiconductor pattern 151) of the components of the semiconductor layer 150. In the pixel PX, the area occupied by the second conductive layer 170 may be greater than the area occupied by the semiconductor layer 150.

The second conductive layer 170 may include a first data line 171-1, a second data line 171-2, a first source electrode 173a (or a first electrode line), a first drain electrode 175a (or a second electrode line), a second source electrode 173b (or a third electrode line), a second drain electrode 175b (or a fourth electrode line), a third source electrode 173c, a third drain electrode 175c, and a voltage division reference line 177.

The first data line 171-1, the second data line 171-2, the first source electrode 173a (or first electrode line, or first electrode pattern), the first drain electrode 175a (or second electrode line, or second electrode pattern), the second source electrode 173b (or third electrode line, or third electrode pattern), the second drain electrode 175b (or fourth electrode line, or fourth electrode pattern), the third source electrode 173c, the third drain electrode 175c, and the voltage division reference line 177 may be made of the same material, and may be located on the same layer.

The first data line 171-1 and the second data line 171-2 may extend substantially along the second direction DR2, and may be spaced apart from each other by a reference distance L0 along the first direction DR1. For example, the reference distance L0 may be 100 μm or less. The first data line 171-1 and the second data line 171-2 may be disposed to overlap the first sub-pixel electrode 191 and the second sub-pixel electrode 192.

As will be described later, the first data line 171-1 may be electrically connected to the first switching element T1 and the second switching element T2 of the pixel PX, and the second data line 171-2 may be electrically connected to a switching element of another pixel located in a row different from that of the pixel PX.

A reference voltage for voltage distribution may be applied to the voltage division reference line 177. As described above, the reference voltage applied to the voltage division reference line 177 may be different from the common voltage applied to the common electrode 270. For example, the voltage level of the reference voltage applied to the voltage division reference line 177 may be higher than the voltage level of the common voltage.

At least a part of the voltage division reference line 177 may be disposed in parallel with the first data line 171-1 and the second data line 171-2. The voltage division reference line 177 may be disposed to overlap the first sub-pixel electrode 191 and the second sub-pixel electrode 192, and may be disposed between the first data line 171-1 and the second data line 171-2 in a plan view, e.g., when viewed in a third direction DR3, which may be perpendicular to the first direction DR1 and the second direction DR2.

Each of the first data line 171-1, the second data line 171-2, and the voltage division reference line 177 may include a portion located directly on the gate insulating layer 140 and in contact with the gate insulating layer 140. The voltage division reference line 177 may intersect the first semiconductor pattern 151. That is, a part of the voltage division reference line 177 may be located on the first semiconductor pattern 151 (or the semiconductor layer 150).

In some exemplary embodiments, the voltage division reference line 177 may be disposed on the first semiconductor pattern 151 and may be located at the inner side (that is, a portion of the first semiconductor pattern 151 that faces or is adjacent to the area center thereof) from the edge of the first semiconductor pattern 151 in the first direction DR1. That is, the first semiconductor pattern 151 may protrude from the voltage division reference line 177 in the first direction DR1 when viewed in a plan view. The length M4 of the portion of the first semiconductor pattern 151 protruding from the voltage division reference line 177 in the first direction DR1 may be 1 to 3 times the width (or the line width WL1) of the voltage division reference line 177. For example, when the width of the voltage division reference line 177 is about 2 μm (or 3 μm), the length M4 of the protrusion of the first semiconductor pattern 151 may be 2 μm to 4 μm, or 2.5 μm to 3 μm.

The first source electrode 173a may be electrically connected to the first data line 171-1, may be disposed on the first semiconductor pattern 151 to intersect the first semiconductor region 151a (or traverse the first semiconductor region 151a), may overlap the first semiconductor region 151a, and may be in contact with the first semiconductor region 151a. A portion of the first source electrode 173a located on the first semiconductor region 151a may have a substantially linear shape.

The first source electrode 173a extends substantially in parallel with the second direction DR2, but may extend from the first semiconductor region 151a toward the first sub-pixel area PA1 and the second sub-pixel area PA2, and may extend to the outside of the first semiconductor region 151a. The length M1 of the protrusion of the first source electrode 173a protruding from the first semiconductor region 151a to one side thereof (for example, a portion protruding upward) may be 1 to 3 times the width (for example, line width WL1) of the first source electrode 173a. For example, when the width of the first source electrode 173a is about 2 μm (or 3 μm), the length M1 of the protrusion of the first source electrode 173a may be 2 μm to 4 μm, or 2.5 μm to 3 μm.

A portion of the first source electrode 173a protruding to the other side may be connected to the second source electrode 173b to be described later, and the first source electrode 173a (or the entirety of the first source electrode 173a and the second source electrode 173b) may be bent in a U shape.

In some exemplary embodiments, the first source electrode 173a may be disposed on the first semiconductor pattern 151 to be located at the inner side (that is, a direction facing the area center of the first semiconductor pattern 151) from the edge of the first semiconductor pattern 151 in the first direction DR1. That is, the first semiconductor pattern 151 may protrude from the first source electrode 173a in the first direction DR1. The length M3 of the portion of the first semiconductor pattern 151 protruding from the first source electrode 173a in the first direction DR1 may be 1 to 3 times the width (or the line width WL1) of the first source electrode 173a. For example, when the width of the first source electrode 173a is about 2 μm (or 3 μm), the length M3 of the protrusion of the first semiconductor pattern 151 may be 2 μm to 4 μm, or 2.5 μm to 3 μm.

The first drain electrode 175a is located on the first semiconductor region 151a, but may intersect the first semiconductor region 151a, may overlap the first semiconductor region 151a, and may be in contact with the first semiconductor region 151a. The first drain electrode 175a may be spaced apart from the first source electrode 173a on the first semiconductor region 151a. The first drain electrode 175a may include a rod portion facing the first source electrode 173a and extending substantially in parallel with the second direction DR2, and may further include an extension portion connected to the end of the rod portion. The rod portion of the first drain electrode 175a extends substantially in parallel with the second direction DR2, but may extend from the first semiconductor region 151a toward the first sub-pixel area PA1 and the second sub-pixel area PA2, and may extend to the outside of the first semiconductor region 151a.

The length M2 of the protrusion of the first drain electrode 175a protruding from the first semiconductor region 151a to the other side thereof (for example, a portion protruding downward) may be 1 to 3 times the width (or line width WL1) of the first drain electrode 175a. For example, when the width of the first drain electrode 175a is about 2 μm (or 3 μm), the length M2 of the protrusion of the first drain electrode 175a may be 2 μm to 4 μm, or 2.5 μm to 3 μm.

In some exemplary embodiments, the total sum of the length M1 of the protrusion of the first source electrode 173a protruding from the first semiconductor region 151a to one side thereof (for example, a portion protruding upward) and the length M2 of the protrusion of the first drain electrode 175a protruding from the first semiconductor region 151a to the other side thereof (for example, a portion protruding downward) may be 2 to 4 times or 2.5 to 3 times the width (or line width WL1) of the first source electrode 173a. For example, the total sum of the length M1 of the protrusion of the first source electrode 173a and the length M2 of the protrusion of the first drain electrode 175a may be 4 μm to 8 μm or 5 μm to 6 μm.

A portion of the first source electrode 173a and the first drain electrode 175a extending to the outside of the first semiconductor region 151a may be in contact with the side surface of the first semiconductor pattern 151.

The second source electrode 173b may be electrically connected to the first data line 171-1, and may be electrically connected to the first source electrode 173a. The second source electrode 173b is disposed on the second semiconductor region 151b (or the boundary between the first semiconductor region 151a and the second semiconductor region 151b), but may intersect the second semiconductor region 151b, may overlap the second semiconductor region 151b, and may be in contact with the second semiconductor region 151b. The second source electrode 173b may be disposed on the first semiconductor pattern 151 to be spaced apart from the first drain electrode 175a by a first distance L1 and to be spaced apart from the second drain electrode 175b by a second distance L2.

Similarly to the first source electrode 173a, the second source electrode 173b extends substantially in parallel with the second direction DR2, but may extend from the second semiconductor region 151b toward the first sub-pixel area PA1 and the second sub-pixel area PA2, and may extend to the outside of the second semiconductor region 151b. The length M1 of the protrusion of the second source electrode 173b protruding from the second semiconductor region 151b to one side thereof (for example, a portion protruding upward) may be substantially equal to the length M1 of the protrusion of the first source electrode 173a protruding from the first semiconductor region 151a to one side thereof (for example, a portion protruding upward).

As described above, a portion of the second source electrode 173b protruding to the other side may be connected to the first source electrode 173a, and may form a U shape with the first source electrode 173a.

The second drain electrode 175b is located on the second semiconductor region 151b, but may intersect the second semiconductor region 151b, may overlap the second semiconductor region 151b, and may be in contact with the second semiconductor region 151b. The second drain electrode 175b may be disposed on the first semiconductor pattern 151 to be spaced apart from the second source electrode 173b by the second distance L2, and may be disposed on the first semiconductor pattern 151 to be spaced apart from the voltage division reference line 177 by a third distance L3. Here, the second distance L2 is the same as or different from the first distance L1, and the third distance L3 is greater than the second distance L2, for example, the third distance L3 may be 2.5 times to 3.5 times, or about 3 times the second distance L2.

Similarly to the first drain electrode 175a, the second drain electrode 175b may include a rod portion facing the second source electrode 173b and extending substantially in parallel with the second direction DR2, and may further include an extension portion connected to the end of the rod portion. The rod portion of the second drain electrode 175b extends substantially in parallel with the second direction DR2, but may extend from the second semiconductor region 151b toward the first sub-pixel area PA1 and the second sub-pixel area PA2, and may extend to the outside of the second semiconductor region 151b.

The length M1 of the protrusion of the second drain electrode 175b protruding from the second semiconductor region 151b to one side thereof (for example, a portion protruding downward) may be substantially equal to the length M1 of the protrusion of the first source electrode 173a protruding from the first semiconductor region 151a to one side thereof (for example, a portion protruding upward)

A portion of the second source electrode 173b and the second drain electrode 175b extending to the outside of the second semiconductor region 151b may be in contact with the side surface of the first semiconductor pattern 151.

The third source electrode 173c may be electrically connected to the voltage division reference line 177. The third source electrode 173c is disposed on the third semiconductor region 151c, but may intersect the third semiconductor region 151c, may overlap the third semiconductor region 151c, and may be in contact with the third semiconductor region 151c. The third source electrode 173c may be a part of the voltage division reference line 177.

The third drain electrode 175c is disposed on the third semiconductor region 151c, but may intersect the third semiconductor region 151c, may overlap the third semiconductor region 151c, and may be in contact with the third semiconductor region 151c. The third drain electrode 175c may be substantially the same as the second drain electrode 175b, or may be a part of the second drain electrode 175b.

In some exemplary embodiments, the first source electrode 173a (or the first electrode line), the first drain electrode 175a (or the second electrode line), the second source electrode 173b (or the third electrode line), and the second drain electrode 175b (or the fourth electrode line) may be spaced apart from each other at regular distances (for example, by a first distance L1 or a second distance L2) on the first semiconductor pattern 151. The channel length may be defined as the distance between a source electrode and a drain electrode on a semiconductor region. Therefore, the channel length of the first switching element T1 may be equal to the channel length of the second switching element T2.

In some exemplary embodiments, the third distance L3 between the second drain electrode 175b (or the third drain electrode 175c) and the voltage division reference line 177 (or the third source electrode 173c) may be three times the second distance L2 between the second source electrode 173b and the second drain electrode 175b. Therefore, the channel length of the third switching element T3 may be three times the channel length of the second switching element T2.

As described above, since the first semiconductor pattern 151 has a uniform width in the first direction DR1, the channel width of the second switching element T2 and the channel width of the third switching element T3 may be equal to each other. Here, the channel width may be a distance defined along a direction perpendicular to the channel length.

However, the second source electrode 173b electrically connected to the first source electrode 173a may act as a source electrode (or an auxiliary source electrode) of the first switching element T1, and the first channel formed between the first source electrode 173a and the first drain electrode 175a and the second channel formed between the second source electrode 173b and the first drain electrode 175a may be connected in parallel to each other such that the channel width of the first switching element T1 may be two times the channel width of the second switching element T2.

As will be later, as a data voltage that is not divided is applied to the first sub-pixel PX1, the luminance of the first sub-pixel PX1 (or the first sub-pixel area PA1) is higher than the luminance of the second sub-pixel PX2 (or the second sub-pixel area PA2), and thus, the first sub-pixel PX may be sensitive to a relatively low gradation (or a low gradation image). The channel width of the first switching element T1 connected to the first sub-pixel PX1 is formed to be relatively large so that deterioration of the display quality of the display device 1 (for example, the quality of the display image with respect to image data including the low gradation) can be prevented or at least reduced.

The second conductive layer 170 may include at least one metal selected from molybdenum (Mo), aluminum (Al), platinum (Pt), palladium (Pd), silver (Ag), magnesium (Mg), gold (Au), neodymium (Nd), iridium (Ir), chromium (Cr), titanium (Ti), tantalum (Ta), tungsten (W), and copper (Cu). The second conductive layer 170 may be a single-layer film or a multilayer film. For example, the second conductive layer 170 may have a laminate structure of Ti/Al/Ti, Mo/Al/Mo, Mo/AlGe/Mo, or Ti/Cu; however, exemplary embodiments are not limited thereto.

The first gate electrode 124a, the first semiconductor region 151a, the first source electrode 173a (and the second source electrode 173b connected to the first source electrode 173a) described above, and the first drain electrode 175a, described above, may constitute the first switching element T1, which is a thin film transistor. The second gate electrode 124b, the second semiconductor region 151b, the second source electrode 173b, and the second drain electrode 175b may constitute the second switching element T2, which is a thin film transistor. The third gate electrode 124c, the third semiconductor region 151c, the third source electrode 173c, and the third drain electrode 175c may constitute the third switching element T3, which is a thin film transistor.

The organic layer 180 may be disposed on the second conductive layer 170. The organic layer 180 may include a material having excellent planarization characteristics and photosensitivity.

The color filter 160 may be disposed between the second conductive layer 170 and the organic layer 180. The color of the color filter 160 may be any one of red, green, and blue, but exemplary embodiments are not limited thereto. As shown in FIGS. 5 and 6, the color filter 160 may be disposed adjacent to a color filter 1601 of a pixel adjacent to one side and a color filter 1602 of a pixel adjacent to the other side. The color filter 160 may be disposed in the first sub-pixel area PA1 and the second sub-pixel area PA2, and may overlap the first sub-pixel electrode 191 and the second sub-pixel electrode 192. The color filter 160 may further be disposed in the switching element area TA, and may overlap the first switching element T1, the second switching element T2, and the third switching element T3.

When the display device 1 includes the color filter 160, the organic layer 180 may be disposed on the color filter 160 to planarize a step of the color filter 160. However, exemplary embodiments are not limited thereto, and any one of the organic layer 180 and the color filter 160 may be omitted. Hereinafter, for convenience of explanation, a case where the display device 1 includes the organic layer 180 and the color filter 160 will be described as an example.

A first contact hole CH1 exposing a part of the first drain electrode 175a and a second contact hole CH2 exposing a part of the second drain electrode 175b may be formed in the color filter 160 and the organic layer 180. The portion exposed through the first contact hole CH1 may be the extension portion 175a1 of the first drain electrode 175a, and the portion exposed through the second contact hole CH2 may be the extension portion 175b1 of the second drain electrode 175b.

The third conductive layer 190 may be disposed on the organic layer 180.

The third conductive layer 190 may include a first sub-pixel electrode 191 and a second sub-pixel electrode 192. Most of the first sub-pixel electrode 191 may be located in the first sub-pixel area PA1, and most of the second sub-pixel electrode 192 may be located in the second sub-pixel area PA2.

The first sub-pixel electrode 191 may be electrically connected to the first drain electrode 175a through the first contact hole CH1. The first sub-pixel electrode 191 may be in contact with the first drain electrode 175a. The second sub-pixel electrode 192 may be electrically connected to the second drain electrode 175b through the second contact hole CH2, and the second sub-pixel electrode 192 may be in contact with the second drain electrode 175b.

The first sub-pixel electrode 191 may include a first stem portion 191a located in the first sub-pixel area PA1, a plurality of first branch portions 191b located in the first sub-pixel area PA1 that extend outward from the first stem portion 191a and are spaced apart from each other with slits 191c respectively disposed therebetween, and a first extension portion 191d extending from the first sub-pixel area PA1 to the switching element area TA.

The first stem portion 191a may include a transverse stem portion extending mainly in the first direction DR1 and a longitudinal stem portion extending mainly in the second direction DR2. The first stem portion 191a may divide the first sub-pixel electrode 191 into sub-regions, for example, domains. The first stem portion 191a may be provided in a cross shape. In this case, the first sub-pixel electrode 191 may be divided into four sub-regions (or four domains) by the first stem portion 191a. The first branch portions 191b located in the respective sub-regions may have different extending directions. For example, the first branch portion 191b located in the sub-region in the upper right direction of FIG. 2 may extend obliquely from the first stem portion 191a in the upper right direction of FIG. 2, and the first branch portion 191b located in the sub-region in the lower right direction of FIG. 2 may extend obliquely from the first stem portion 191a in the lower right direction of FIG. 2. Further, the first branch portion 191b located in the sub-region in the upper left direction of FIG. 2 may extend obliquely from the first stem portion 191a in the upper left direction of FIG. 2, and the first branch portion 191b located in the sub-region in the lower left direction of FIG. 2 may extend obliquely from the first stem portion 191a in the lower left direction of FIG. 2.

The first extension portion 191d may extend from the first stem portion 191a or the first branch portion 191b to the switching element area TA and may be connected to the first drain electrode 175a through the first contact hole CH1.

Similarly to the first sub-pixel electrode 191, the second sub-pixel electrode 192 may include a second stem portion 192a located in the second sub-pixel area PA2, a plurality of second branch portions 192b located in the second sub-pixel area PA2 that extend outward from the second stem portion 192a and are spaced apart from each other with slits 192c respectively disposed therebetween, and a second extension portion 192d extending from the second sub-pixel area PA2 to the switching element area TA.

Since the second stem portion 192a, the second branch portions 192b, and the second extension portion 192d are substantially the same as or similar to the first stem portion 191a, the first branch portions 191b, and the first extension portion 191d, redundant descriptions will not be repeated. It is noted, however, that the second extension portion 192d may extend from the second stem portion 192a or the second branch portion 192b to the switching element area TA and may be connected to the second drain electrode 175b through the second contact hole CH2.

The first sub-pixel electrode 191 may overlap the first data line 171-1 and the second data line 171-2. A portion of the first data line 171-1 and the second data line 171-2 located in the first sub-pixel area PA1 may completely overlap the first sub-pixel electrode 191. For example, the overlap width WO1 between the first data line 171-1 and the first sub-pixel electrode 191 in the first sub-pixel area PA1 may be substantially equal to the line width WD1 of the first data line 171-1, and the overlap width WO2 between the second data line 171-2 and the first sub-pixel electrode 191 in the first sub-pixel area PA1 may be substantially equal to the line width WD2 of the second data line 171-2.

Similarly, the second sub-pixel electrode 192 may overlap the first data line 171-1 and the second data line 171-2. A portion of the first data line 171-1 and the second data line 171-2 located in the second sub-pixel area PA2 may completely overlap the second sub-pixel electrode 192. For example, the overlap width WO3 between the first data line 171-1 and the second sub-pixel electrode 192 in the second sub-pixel area PA2 may be substantially equal to the line width WD1 of the first data line 171-1, and the overlap width WO4 between the second data line 171-2 and the second sub-pixel electrode 192 in the second sub-pixel area PA2 may be substantially equal to the line width WD2 of the second data line 171-2.

The third conductive layer 190 may include at least one metal selected from molybdenum (Mo), aluminum (Al), platinum (Pt), palladium (Pd), silver (Ag), magnesium (Mg), gold (Au), neodymium, (Nd), iridium (Ir), chromium (Cr), titanium (Ti), tantalum (Ta), tungsten (W), and copper (Cu). The third conductive layer 190 may be a single-layer film or a multilayer film. For example, the third conductive layer 190 may have a laminate structure of Ti/Al/Ti, Mo/Al/Mo, Mo/AlGe/Mo, or Ti/Cu; however, exemplary embodiments are not limited thereto.

The first conductive layer 120 may further include a first sustain line 127 and a second sustain line 128. A sustain voltage may be applied to the first sustain line 127 and the second sustain line 128. The sustain voltage may be the same as the common voltage applied to the common electrode 270, but exemplary embodiments are not limited thereto. For example, the sustain voltage may have a different voltage level than the voltage provided to the voltage division reference line 177 and/or the common electrode 270.

The first sustain line 127 and the second sustain line 128 are made of the same material as the gate line 121 and may be located on the same layer as the gate line 121.

The first sustain line 127 may include a first portion 1271 extending in the first direction DR1 substantially the same as the gate line 121, a second portion 1273 extending from the first portion 1271 in the second direction DR2 and disposed adjacent to one side (e.g., left side in FIG. 2) of the first sub-pixel electrode 191, a third portion 1275 extending from the first portion 1271 in the second direction DR2 and disposed adjacent to the other side (e.g., right side in FIG. 2) of the first sub-pixel electrode 191, and a fourth portion 1277 protruding from the first portion 1271.

The second portion 1273 and the third portion 1275 of the first sustain line 127 may not overlap the first sub-pixel electrode 191. The second portion 1273 and the third portion 1275 may function as a light blocking pattern for preventing light transmission at both sides (e.g., left and right sides in FIG. 2) of the first sub-pixel electrode 191.

The fourth portion 1277 of the first sustain line 127 may overlap the extension portion 175a1 of the first drain electrode 175a and may form a sustain capacitance in the first sub-pixel area PA1. In this manner, the fourth portion 1277 of the first sustain line 127 and the extension portion 175a1 of the first drain electrode 175a may form electrodes of a first capacitor CST1. Further, the fourth portion 1277 of the first sustain line 127 may partially overlap a portion of the first sub-pixel electrode 191.

In some exemplary embodiments, the fourth portion 1277 of the first sustain line 127 has an area smaller than that of the extension portion 175a1 of the first drain electrode 175a, and may be located inward from the edge of the extension portion 175a1 of the first drain electrode 175a on the plan view. For example, the fourth portion 1277 of the first sustain line 127 may be located inward by a fifth distance M5 from the edge of the extension portion 175a1 of the first drain electrode 175a in the second direction DR2, and may be located inward by a sixth distance M6 from the edge of the extension portion 175a1 of the first drain electrode 175a in the first direction DR1. Here, the fifth distance M5 and the sixth distance M6 may be the same as or similar to the first distance M1 and the third distance M3, described above, respectively. That is, the extension portion 175a1 of the first drain electrode 175a may completely cover the fourth portion 1277 of the first sustain line 127. However, exemplary embodiments are not limited thereto. For example, the fourth portion 1277 of the first sustain line 127 may be completely covered by the extension portion 175a1 of the first drain electrode 175a in a plan view.

Similarly to the first sustain line 127, the second sustain line 128 may include a fifth portion 1281 extending in the first direction DR1 substantially the same as the gate line 121, a sixth portion 1283 extending from the fifth portion 1281 in the second direction DR2 and disposed adjacent to one side (e.g., left side in FIG. 2) of the second sub-pixel electrode 192, a seventh portion 1285 extending from the fifth portion 1281 in the second direction DR2 and disposed adjacent to the other side (e.g., right side in FIG. 2) of the second sub-pixel electrode 192, and an eighth portion 1287 protruding from the fifth portion 1281.

The sixth portion 1283 and the seventh portion 1285 of the second sustain line 128 may not overlap the second sub-pixel electrode 192. The sixth portion 1283 and the seventh portion 1285 may function as a light blocking pattern for preventing light transmission at both sides (e.g., left and right sides in FIG. 2) of the second sub-pixel electrode 192.

The eighth portion 1287 of the second sustain line 128 may partially overlap the extension portion 175b1 of the second drain electrode 175b and may form a sustain capacitance in the second sub-pixel area PA2. In this manner, the eighth portion 1287 of the second sustain line 128 and the extension portion 175b1 of the second drain electrode 175b may form electrodes of a second capacitor CST2. The eighth portion 1287 of the second sustain line 128 may also partially overlap a portion of the second sub-pixel electrode 192.

The third conductive layer 190 may further include a first blocking electrode SHE1, a second blocking electrode SHE2, and a connection electrode SHEc. The first blocking electrode SHE1, the second blocking electrode SHE2, and the connection electrode SHEc may be disposed on the same layer as the first sub-pixel electrode 191 and the second sub-pixel electrode 192, and may be made of the same material as the first sub-pixel electrode 191 and the second sub-pixel electrode 192.

The first blocking electrode SHE1, the second blocking electrode SHE2, and the connection electrode SHEc may be physically spaced apart from the first sub-pixel electrode 191 and the second sub-pixel electrode 192.

The first blocking electrode SHE1 may be disposed on the organic layer 180 and overlap the second portion 1273 of the first sustain line 127 and the sixth portion 1283 of the second sustain line 128.

The second blocking electrode SHE2 may be disposed on the organic layer 180 and overlap the third portion 1275 of the first sustain line 127 and the seventh portion 1285 of the second sustain line 128.

The first blocking electrode SHE1 may completely cover the second portion 1273 of the first sustain line 127 and the sixth portion 1283 of the second sustain line 128 in a plan view. The line width of the first blocking electrode SHE1 or the width WS1 of the first blocking electrode SHE1 in the first direction DR1 may be greater than the line width WC1 of the second portion 1273 and the line width WC3 of the sixth portion 1283. Similarly, the second blocking electrode SHE2 may completely cover the third portion 1275 of the first sustain line 127 and the seventh portion 1285 of the second sustain line 128 in a plan view. The line width of the second blocking electrode SHE2 or the width WS2 of the second blocking electrode SHE2 in the first direction DR1 may be larger than the line width WC2 of the third portion 1275 and the line width WC4 of the seventh portion 1285.

The connection electrode SHEc may electrically connect the first blocking electrode SHE1 and the second blocking electrode SHE2 to each other.

A voltage of the same level as the common voltage applied to the common electrode 270 may be applied to the first blocking electrode SHE1 and the second blocking electrode SHE2. In this case, an electric field may not be formed between the common electrode 270 and the first blocking electrode SHE1 or between the common electrode 270 and the second blocking electrode SHE2. Accordingly, a possibility of misalignment of the liquid crystal molecules located at both sides of the first sub-pixel electrode 191 and the second sub-pixel electrode 192 can be reduced, and light leakage can also be reduced. In addition, the area of a light blocking member 220 formed to prevent light leakage can be further reduced, or the light blocking member 220 may be omitted. Therefore, the aperture ratio of the display device 1 can be further increased.

Hereinafter, the second substrate 200 will be described in more detail.

The second substrate 200 may include a second base substrate 210, a light blocking member 220, an overcoat layer 250, and a common electrode 270.

Similarly to the first base substrate 110, the second base substrate 210 may be an insulating substrate. The second base substrate 210 may include a polymer or plastic having high heat resistance. The second base substrate 210 may have flexibility.

The light blocking member 220 may be disposed on one surface of the second base substrate 210 facing the first base substrate 110. The light blocking member 220 may overlap the switching element area TA. The light blocking member 220 may include a light-blocking pigment, such as black carbon, or an opaque material, such as chromium (Cr), and may include a photosensitive organic material. In some exemplary embodiments, the light blocking member 220 may be provided in (or as part of) the first substrate 100.

The overcoat layer 250 may be formed on one surface of the second base substrate 210 to cover the light blocking member 220. The overcoat layer 250 may planarize the step formed by the light blocking member 220. The overcoat layer 250 may be omitted.

The common electrode 270 may be disposed on the overcoat layer 250. When the overcoat layer 250 is omitted, the common electrode 270 may be disposed on the second base substrate 210 and the light blocking member 220. The common electrode 270 may be made of a transparent conductive material, such as ITO (an oxide including indium and tin) or IZO (an oxide including indium and zinc), but exemplary embodiments are not limited thereto. The common electrode 270 may be formed over the entire surface of the second base substrate 210. A common voltage is applied to the common electrode 270, and the common electrode 270 may form an electric field together with the first sub-pixel electrode 191 and the second sub-pixel electrode 192. In this case, alignment of the liquid crystal molecules in the liquid crystal layer 300 changes depending on the intensity of the electric field, and thus, light transmittance can be controlled.

Hereinafter, a relationship between the first to third switching elements T1, T2, and T3 will be described in more detail with reference to FIG. 7, and a sustain capacitance related to the visibility of the display device 1 and a gate capacitance of the first switching element T1 will be described with reference to FIG. 7.

Figure 7:
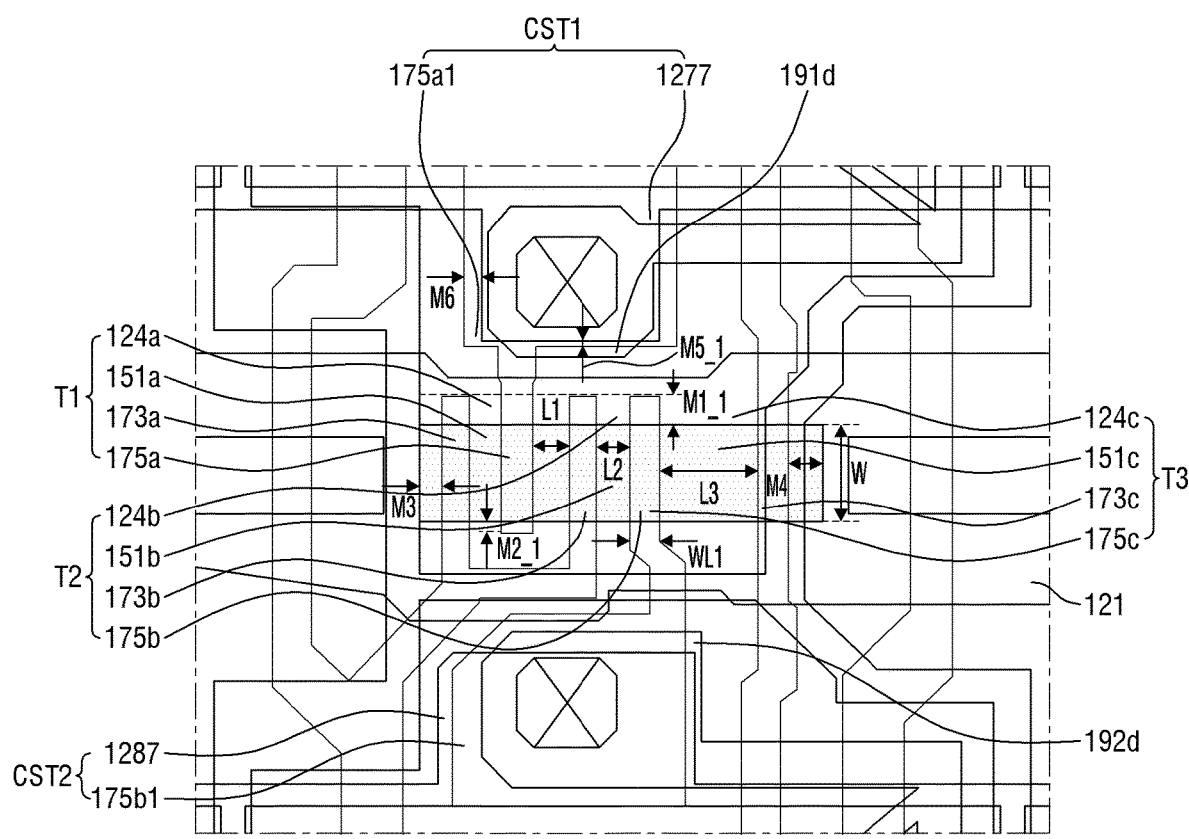
FIG. 7 is a view for explaining a case where a second conductive layer included in a pixel of the display device of FIG. 1 is shifted according to some exemplary embodiments.
Figure 7:
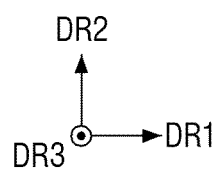

FIG. 7 is a view for explaining a case where a second conductive layer included in a pixel of the display device of FIG. 1 is shifted according to some exemplary embodiments.

Referring to FIGS. 3 and 7, the following description will be made on the assumption that the second conductive layer 170 included in the display device 1 is shifted upward by the line width WL1 (for example, about 2 μm).

As described above, the second conductive layer 170 may be formed using a mask different from a mask for forming the semiconductor layer 150. In this case, depending on one or more process errors, the alignment between the second conductive layer 170 and the semiconductor layer 150 may be distorted or changed. That is, the second conductive layer 170 may be shifted upward, downward, leftward, or rightward with respect to the semiconductor layer 150 by a specific size or distance.

As the second conductive layer 170 is shifted upward, the first source electrode 173a and the first drain electrode 175a may be shifted upward with respect to the first semiconductor pattern 151. In this case, the channel width and channel length of the first switching element T1 may not change. The reason for this is that the first switching element T1 has an I-shaped channel and the first source electrode 173a and the first drain electrode 175a are formed to extend to the outside the first semiconductor pattern 151 by the first distance M1 (and/or the second distance M2) or more.

As shown in FIG. 7, even if the first drain electrode 175a is shifted upward, the first drain electrode 175a may have a state of protruding downward from the first semiconductor pattern 151 by a specific length M2_1 (for example, about 1 μm).

That is, the shape and area of a portion where the first source electrode 173a overlaps the first semiconductor pattern 151 do not change, the shape and area of a portion where the first drain electrode 175a overlaps the first semiconductor pattern 151 do not change, and the shape and area of the first semiconductor region 151a forming a channel therebetween do not change. Therefore, the channel width and channel length of the first switching element T1 may not change.

Similarly, as the second conductive layer 170 is shifted upward, the second source electrode 173b and the second drain electrode 175b may be shifted upward with respect to the first semiconductor pattern 151. Even in this case, the channel width and channel length of the second switching element T2 may be maintained constant without changing. The reason for this is that the second switching element T2 has an I-shaped channel and the second source electrode 173b and the second drain electrode 175b are formed to extend to the outside the first semiconductor pattern 151 by the first distance M1 (and/or the second distance M2) or more.

Similarly, as the second conductive layer 170 is shifted upward, the third source electrode 173c and the third drain electrode 175c may be shifted upward with respect to the first semiconductor pattern 151. Even in this case, the channel width and channel length of the third switching element T3 may be maintained constant without changing. The reason for this is that, similarly to the first and second switching elements T1 and T2, the third switching element T3 has an I-shaped channel and the third source electrode 173c and the third drain electrode 175c are formed to extend to the outside the first semiconductor pattern 151 by the first distance M1 (and/or the second distance M2) or more.

Unlike that shown in FIG. 7, even if the second conductive layer 170 is shifted leftward, downward, and/or rightward, the channel width and channel length of each of the first switching element T1, the second switching element T2, and the third switching element T3 may be maintained constant without changing. The reason for this is that the first source electrode 173a is located inward by a third distance M3 (for example, about 3 μm) from the first semiconductor pattern 151, and the third source electrode 173c (or the voltage division reference line 177) is also located inward by a fourth distance M4 (for example, about 3 μm).

Only a part of the data voltage having passed through the second switching element T2 may be output to the second drain electrode 175b due to the third switching element T3 and applied to the second sub-pixel electrode 192. The data voltage is divided by a resistance ratio between the second switching element T2 and the third switching element T3, and the resistance ratio may be determined by an aspect ratio, which is major characteristic of switching elements, such as thin film transistors (TFT). Here, the aspect ratio may be a ratio of a channel width to a channel length.

For example, a relationship (that is, a data voltage ratio) between a first data voltage V1 provided to the first sub-pixel electrode 191 through the first drain electrode 175*a* and a second data voltage V2 provided to the second sub-pixel electrode 192 through the second drain electrode 175*b* may be represented by "V2/V1=(CW2/CL2)/{(CW2/CL2)+(CW3/CL2)}." Here, V1 is a first data voltage, V2 is a second data voltage, CW2 and CL2 are channel width and channel length of the second switching element T2, and CW3 and CL3 are channel width and channel length of the third switching element T3. That is, the voltage ratio between the first data voltage and the second data voltage may be determined by the channel width and channel length of each of the second and third switching elements T2 and T3.

Even if the alignment between the second conductive layer 170 and the semiconductor layer 150 changes due to one or more process errors, the channel width and channel length of the second switching element T2 and the channel width and channel length of the third switching element T3 do not change. Therefore, the voltage ratio between the first and second data voltages V1 and V2 does not change, and the display quality and visibility of the display device 1 for each region may be uniformly maintained.

The change of gate capacitance of the first switching element T1 (that is, capacitance formed by the overlapping of the first gate electrode 124*a* and the semiconductor layer 150) and the change of sustain capacitance of the first sub-pixel PX1 may change the kickback voltage of the first switching element T1. Further, the scattering (or nonuniform distribution) of the kickback voltage of the pixels PX may cause afterimages on the display image or deteriorate visibility. In this regard, the gate capacitance of the first switching element T1 and the sustain capacitance of the first sub-pixel PX1 will be described.

First, regarding the gate capacitance of the first switching element T1, as the second conductive layer 170 is shifted upward, the first drain electrode 175*a* may be shifted upward. Even in this case, the area of a portion where the first drain electrode 175*a* overlaps the first semiconductor pattern 151 does not change, and thus, the gate capacitance of the first switching element T1 may not change. The reason for this is that the rod portion of the first drain electrode 175*a* extends in the second direction DR2 in the first sub-pixel area PA1 toward the second sub-pixel area PA2, and protrudes by a specific length (for example, the second length M2) toward the outside of the first semiconductor pattern 151.

Regarding the sustain capacitance of the first sub-pixel PX1, as the second conductive layer 170 is shifted upward, the first drain electrode 175*a* may be shifted upward. That is, the extension portion 175*a*1 of the first drain electrode 175*a* may be shifted upward with respect to the fourth portion 1277 of the first sustain line 127. Even in this case, the overlap area between the fourth portion 1277 of the first sustain line 127 and the extension portion of the first drain electrode 175*a* does not change, and thus, the sustain capacitance of the first sub-pixel PX1 may not change. The reason for this is that the rod portion of the first drain electrode 175*a* extends in the second direction DR2 in the first sub-pixel area PA1 toward the second sub-pixel area PA2, and protrudes by a specific length (for example, the second length M2) toward the outside of the first semiconductor pattern 151. Moreover, the extension portion 175*a*1 of the first drain electrode 175*a* has a larger area than the fourth portion 1277 of the first sustain line 127, and completely covers the fourth portion 1277 of the first sustain line 127 with a sufficient margin (for example, a sixth distance M6 in the first direction DR1 and a fifth distance M5 in the second direction DR2).

As described above, each of the first to third switching elements T1, T2, and T3 may have a I-shaped channel, the source electrode and drain electrode of each of the first to third switching elements T1, T2, and T3 may intersect the first semiconductor pattern 151 and extend toward the outside of the first semiconductor pattern 151 with a sufficient margin (for example, first and second distances M1 and M2 in the second direction DR2) (or may completely overlap the first semiconductor pattern 151 in a plan view and traverse a region longer than the first semiconductor pattern 151 by the sum of the first and second distances M1 and M2 in the second direction DR2), and the first semiconductor pattern 151 may completely cover the source electrodes and drain electrodes of the first to third switching elements T1, T2, and T3 in a width direction in a plan view with a sufficient margin (for example, the third and fourth distances M3 and M4 in the first direction DR1). Therefore, even if an alignment change or an error occurs between the semiconductor layer 150 and the second conductive layer 170, the channel width and channel length of each of the first to third switching elements T1, T2, and T3 do not change, the voltage ratio between the first data voltage V1 to the first sub-pixel PX1 and the second data voltage V2 to the second sub-pixel PX2 does not change, and thus, the display quality and visibility of the display device 1 for each region may be uniformly maintained.

Further, as the gate capacitance of the first switching element T1 is maintained constant without changing, the kickback voltage of the first switching element T1 is maintained constant, and the afterimage of the display image due to the scattering of the kickback voltages of the pixels PX and the deterioration of visibility can be prevented.

Moreover, as the extension portion 175*a*1 of the first drain electrode 175*a* forming the sustain capacitance of the first sub-pixel PX1 completely covers the fourth portion 1277 of the first sustain line 127 with a sufficient margin (for example, the sixth distance M6 in the first direction DR1 and the fifth distance M5 in the second direction DR2), the change in the kickback voltage of the first switching element T1 can be prevented, and the afterimage of the display image due to the scattering of the kickback voltages of the pixels PX and the deterioration of visibility can be prevented.

Figure 8:
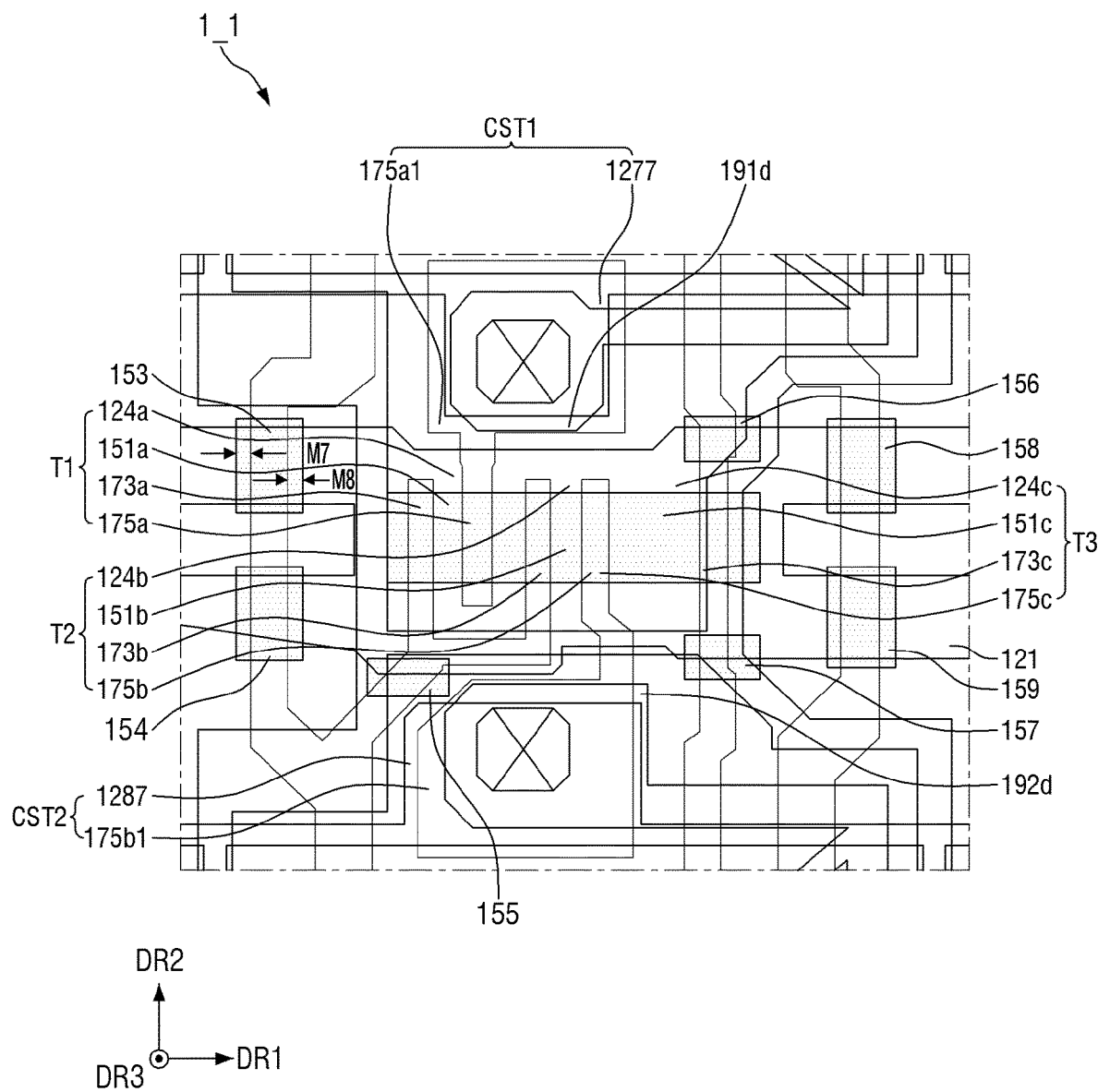
FIG. 8 is a view showing another example of a pixel of the display device of FIG. 1 according to some exemplary embodiments.

FIG. 8 is a view showing another example of a pixel of the display device of FIG. 1 according to some exemplary embodiments.

Referring to FIGS. 3 and 8, a display device 1_1 is different from the display device 1 of FIG. 3 in that the display device 1_1 further includes third to ninth semiconductor patterns 153 to 159. Accordingly, primarily the differences will be described below.

The third to ninth semiconductor patterns 153 to 159 are included in the semiconductor layer 150, and may be formed through the same process as the first semiconductor pattern 151. The third to ninth semiconductor patterns 153 to 159 may be disposed between the gate insulating layer 140 and the second conductive layer 170, and may support the first data line 171-1, the second data line 171-2, the first source electrode 173*a* (or the first electrode line), the second source electrode 173*b* (or the third electrode line), and the voltage division reference line 177 that are included in the second conductive layer 170.

The third semiconductor pattern 153 may be disposed on the first overlap portion of the gate line 121 (for example, the upper portion of the gate line 121) of the region where the gate line 121 and the first data line 171-1 overlap each other. The third semiconductor pattern 153 may completely cover the first overlap portion of the gate line 121. For example, the third semiconductor pattern 153 may have an area larger than the area of the first overlap portion of the gate line 121, may protrude up and down in the second direction DR2, and may protrude left and right in the first direction DR1 by a certain distance. For example, the third semiconductor pattern 153 may protrude left by a seventh distance M7 from the first overlap portion of the gate line 121, and may protrude right by an eighth distance M8 therefrom. The seventh distance M7 and the eighth distance M8 may be the same or similar to the third distance M3 and the fourth distance M4, described above, respectively.

As the third semiconductor pattern 153 completely covers the first overlap portion of the gate line 121, the third semiconductor pattern 153 may fully support the first data line 171-1 even if the alignment between the semiconductor layer 150 and the second conductive layer 170 changes.

As the display device 1_1 becomes larger in size, the length of the first data line 171-1 (and/or the gate line 121) (that is, an extension length in a plan view) increases such that the resistance of the first data line 171-1 may increase, and signal reduction and delay may occur. To reduce the resistance of the first data line 171-1, the first data line 171-1 may have a sufficiently large thickness. The third semiconductor pattern 153 supports the first data line 171-1, thereby mitigating or eliminating defects, such as interference and disconnection, due to an increase in the thickness of the first data line 171-1.

Similarly, the fourth semiconductor pattern 154 may be disposed on the second overlap portion of the gate line 121 (for example, the lower portion of the gate line 121) of a region where the gate line 121 and the first data line 171-1 overlap each other. The fourth semiconductor pattern 154 may completely cover the second overlap portion of the gate line 121. For example, the fourth semiconductor pattern 154 may have an area larger than the area of the second overlap portion of the gate line 121, may protrude up and down in the second direction DR2, and may protrude left and right in the first direction DR1 by a certain distance. Although it is shown in FIG. 8 that the fourth semiconductor pattern 154 is separated from the third semiconductor pattern 153, exemplary embodiments are not limited thereto. For example, the third semiconductor pattern 153 and the fourth semiconductor pattern 154 may be integrally formed.

The fifth semiconductor pattern 155 may be disposed on a third overlap portion of the gate line 121, overlapping a connection line for connecting the first source electrode 173a (and the second source electrode 173b with the first data line 171-1, and may support the connection line. The fifth semiconductor pattern 155 may be disposed to be spaced apart from the first semiconductor pattern 151, and may not be provided with a channel.

The sixth semiconductor pattern 156 may be disposed on a fourth overlap portion of the gate line 121 (for example, an upper portion of the gate line 121) of a region where the voltage division reference line 177 and the gate line 121 overlap each other, and may support the voltage division reference line 177. The sixth semiconductor pattern 156 may be disposed to be spaced apart from the first semiconductor pattern 151, and may not be provided with a channel.

The seventh semiconductor pattern 157 may be disposed on a fifth overlap portion of the gate line 121 (for example, a lower portion of the gate line 121) of a region where the voltage division reference line 177 and the gate line 121 overlap each other, and may support the voltage division reference line 177. The seventh semiconductor pattern 157 may be disposed to be spaced apart from the first semiconductor pattern 151, and may not be provided with a channel.

The eighth semiconductor pattern 158, similarly to the third semiconductor pattern 153, may be disposed on a sixth overlap portion of the gate line 121 (for example, an upper portion of the gate line 121) of a region where the gate line 121 and the second data line 171-2 overlap each other, and may support the second data line 171-2.

Similarly, the ninth semiconductor pattern 159 may be disposed on a seventh overlap portion of the gate line 121 (for example, a lower portion of the gate line 121) of a region where the gate line 121 and the second data line 171-2 overlap each other, and may support the second data line 171-2.

As described above with reference to FIG. 8, the display device 1_1 may support lines with increased thickness for resistance reduction (for example, the first data line 171-1, and the like) through the third to ninth semiconductor patterns 153 to 159, and can reduce defects, such as interference between lines due to thickness increases, disconnections, and the like.

Figure 9:
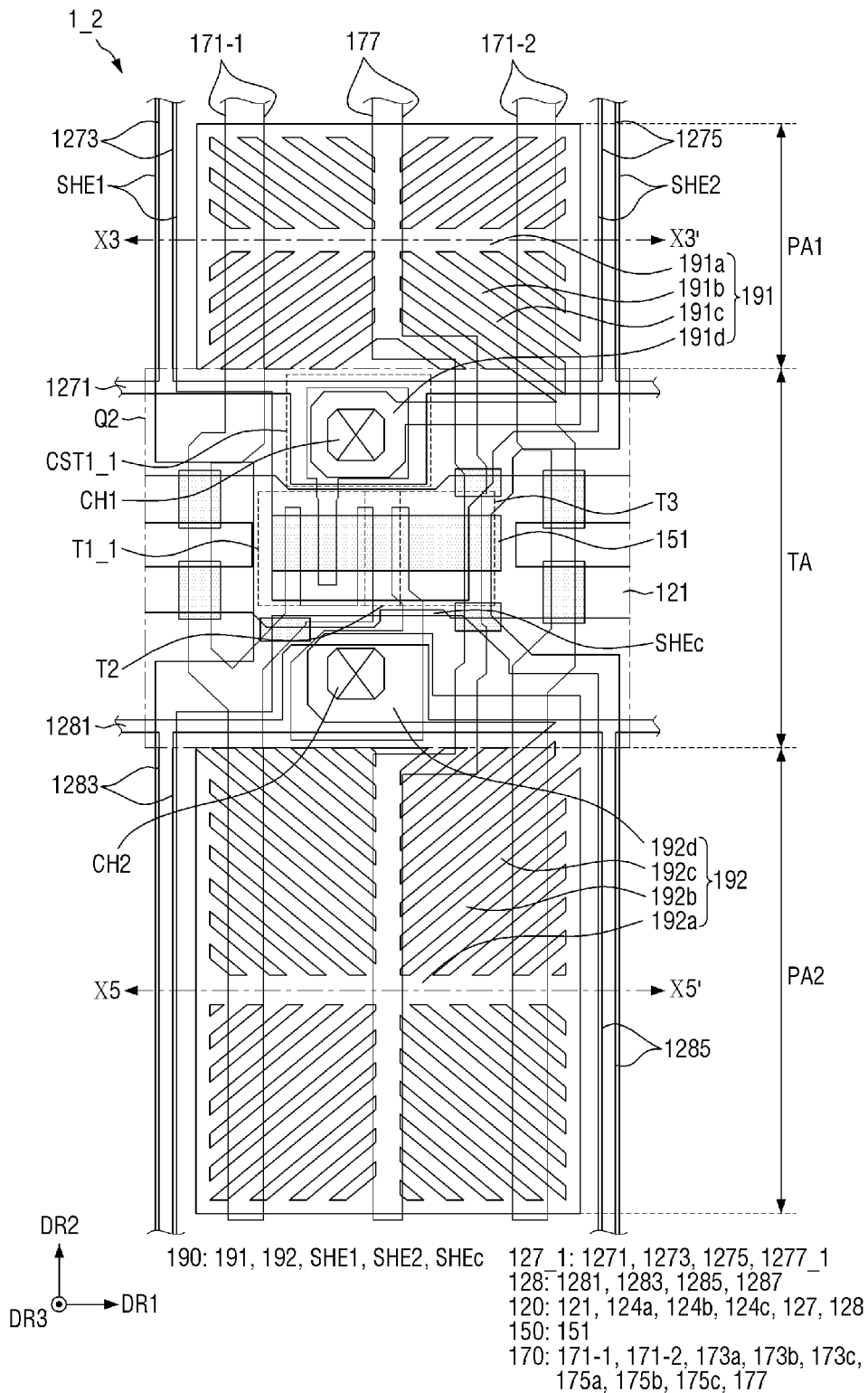
FIG. 9 is a layout view showing another example of a pixel of the display device of FIG. 1 according to some exemplary embodiments.
Figure 10:
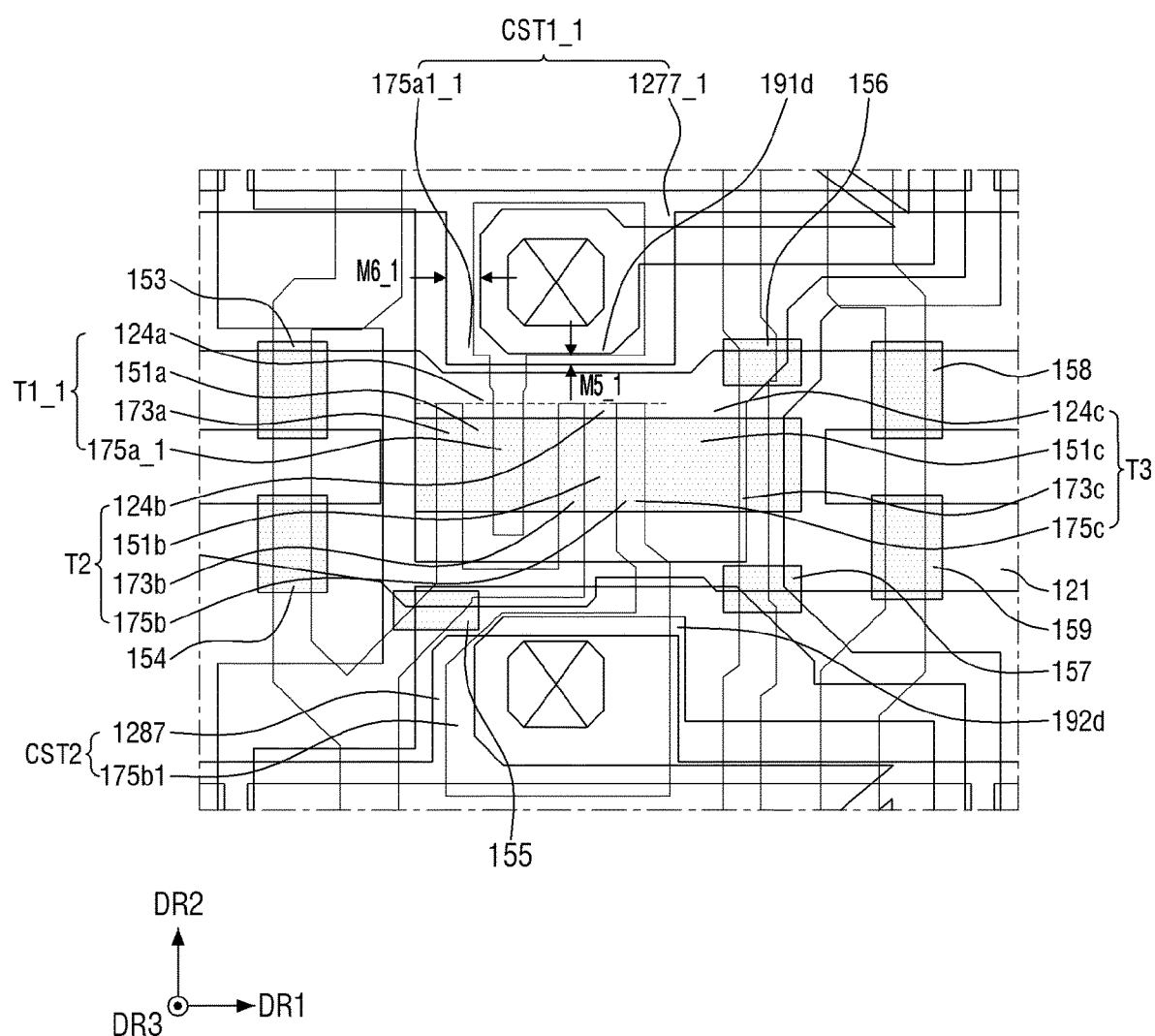
FIG. 10 is an enlarged view of the area Q2 in FIG. 9 according to some exemplary embodiments.

FIG. 9 is a layout view showing another example of a pixel of the display device of FIG. 1 according to some exemplary embodiments. FIG. 10 is an enlarged view of the area Q2 in FIG. 9 according to some exemplary embodiments.

Referring to FIGS. 2, 3, 8, 9, and 10, a display device 1_2 of FIGS. 9 and 10 is different from the display devices 1 and 1_1 of FIGS. 2, 3, and 8 in that the display device 1_2 further includes a first sustain line 127_1 and a first drain electrode 175a_1 of a first switching element T1_1. The display device 1_2 is substantially the same as or similar to the display devices 1 and 1_1 of FIGS. 2, 3, and 8 except for the first sustain line 127_1 and the first drain electrode 175a_1. Therefore, redundant descriptions will not be repeated or primarily omitted.

The first sustain line 127_1 may be substantially the same as or similar to the first sustain line 127 having been described with reference to FIGS. 2 and 3, except for a fourth portion 1277_1. The fourth portion 1277_1 of the first sustain line 127_1 has a rectangular planar shape, and may be formed larger than the fourth portion 1277 of the first sustain line 127.

The first drain electrode 175a_1 may include a rod portion and an extension portion 175a1_1. The rod portion, as described with reference to FIGS. 2 and 3, may overlap the first semiconductor pattern 151 (and the gate line 121) and extend substantially in parallel with the second direction DR2.

The extension portion 175a1_1 of the first drain electrode 175a_1 has a rectangular planar shape and overlaps the fourth portion 1277_1 of the first sustain line 127_1, but may have a smaller area than the fourth portion 1277_1 of the first sustain line 127_1, and may completely overlap the fourth portion 1277_1 of the first sustain line 127_1 in a plan view.

The extension portion 175a1_1 of the first drain electrode 175a_1 may be located inward by a sixth distance M6_1 in the first direction DR1 from the edge of the fourth portion 1277_1 of the first sustain line 127_1, and may be located inward by a fifth distance M5_1 in the second direction DR2 from another edge of the fourth portion 1277_1 of the first sustain line 127_1. Here, the fifth distance M5_1 and the sixth distance M6_1 may be the same as the fifth distance M5 and the sixth distance M6, described with reference to FIG. 3, respectively.

That is, in FIGS. 2, 3, and 8, the extension portion 175a_1 of the first drain electrode 175a may cover the fourth portion 1277 of the first sustain line 127 in a plan view, but in FIGS. 9 and 10, the fourth portion 1277_1 of the first sustain line 127_1 may cover the extension portion 175a1_1 of the first drain electrode 175a_1 in a plan view.

The sustain capacitance of the first sub-pixel area PA1 may be determined by the area where the fourth portion 1277_1 of the first sustain line 127_1 overlaps the extension portion 175a1_1 of the first drain electrode 175a_1. In this manner, the fourth portion 1277_1 of the first sustain line 127_1 and the extension portion 175a1_1 of the first drain electrode 175a_1 may form electrodes of a first capacitor CST1_1. As such, the fourth portion 1277_1 of the first sustain line 127_1 is formed to be larger than the extension portion 175a1_1 of the first drain electrode 175a_1 such that a change in the sustain capacitance of the first sub-pixel area PA1, e.g., a change in the sustain capacitance of the first capacitor CST1_1, due to alignment changes (or shifting) of the second conductive layer 170 can be prevented or at least mitigated.

Figure 11:
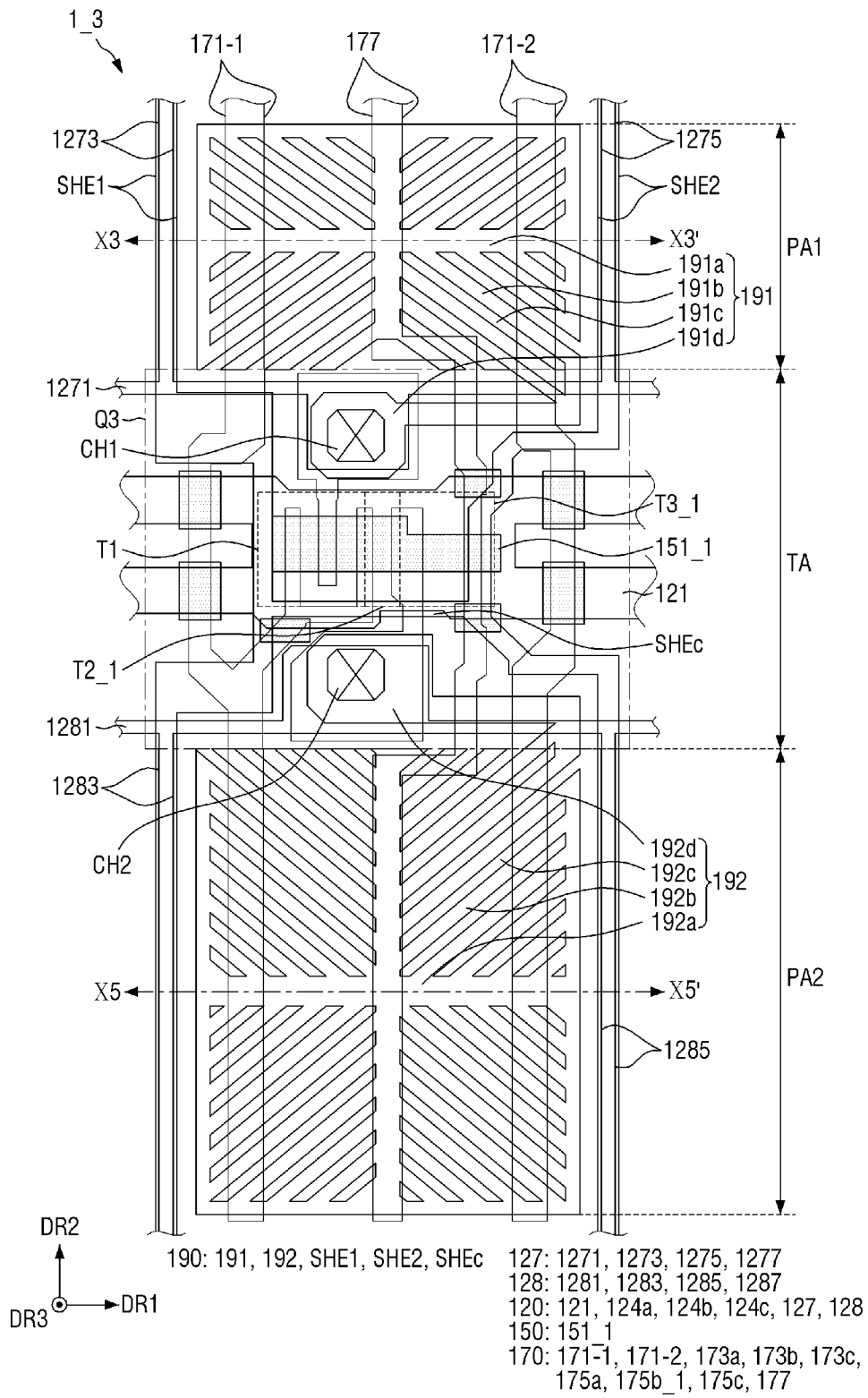
FIG. 11 is a layout view showing still another example of a pixel of the display device of FIG. 1 according to some exemplary embodiments.
Figure 12:
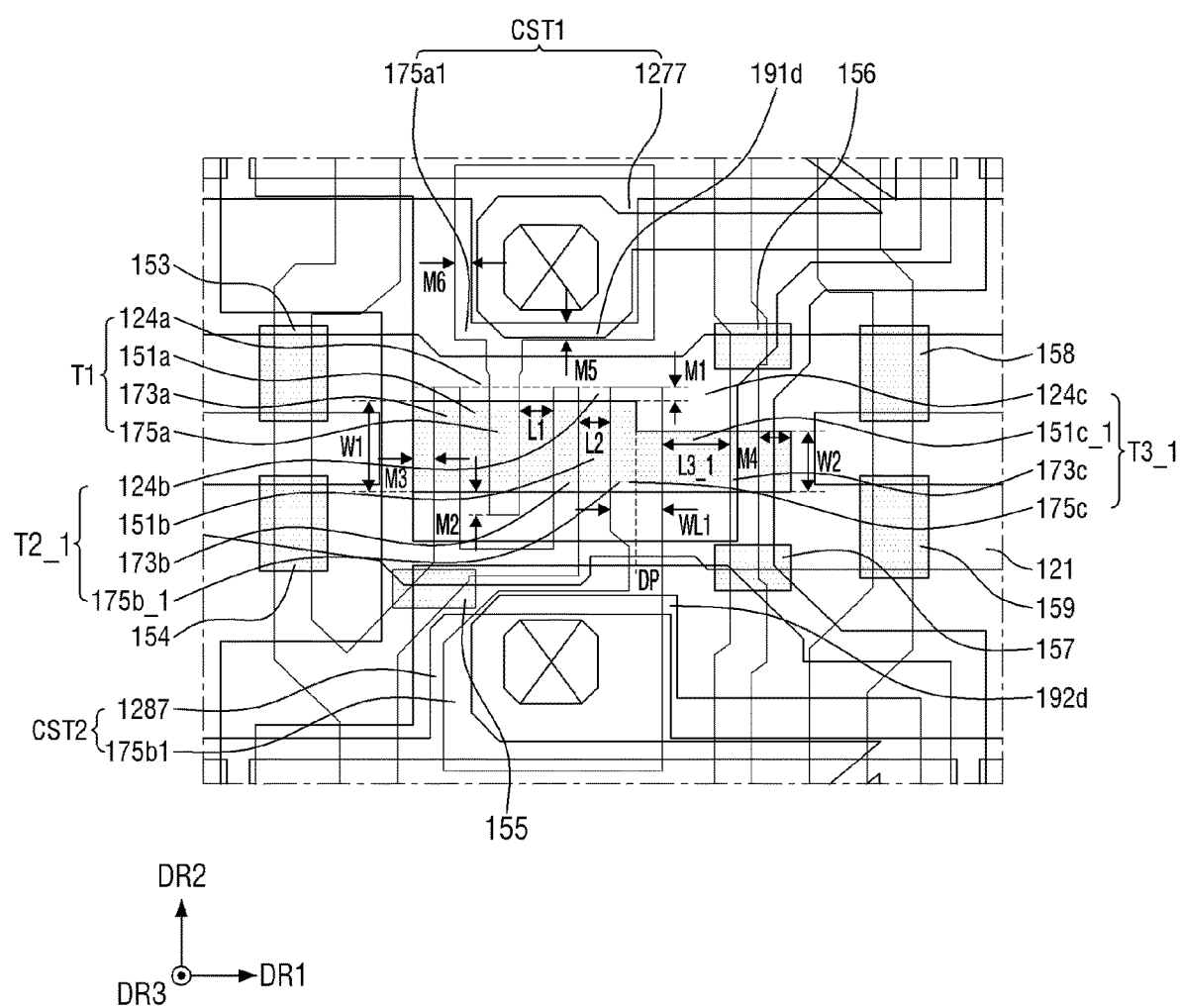
FIG. 12 is an enlarged view of the area Q3 in FIG. 11 according to some exemplary embodiments.

FIG. 11 is a layout view showing still another example of a pixel of the display device of FIG. 1 according to some exemplary embodiments. FIG. 12 is an enlarged view of the area Q3 in FIG. 11 according to some exemplary embodiments.

Referring to FIGS. 2, 3, 8, 11, and 12, a display device 1_3 is different from the display devices 1 and 1_1 of FIGS. 2 and 8 in that the display device 1_3 further includes a first semiconductor pattern 151_1 and a second drain electrode 175b_1 (or a fourth electrode line) of a second switching element T2_2.

The first semiconductor pattern 151_1 may include a first semiconductor region 151a, a second semiconductor region 151b, and a third semiconductor region 151c_1. The first semiconductor region 151a, the second semiconductor region 151b, and the third semiconductor region 151c_1 are substantially the same as or similar to the first semiconductor region 151a, the second semiconductor region 151b, and the third semiconductor region 151c described with reference to FIGS. 2 and 3. Therefore, redundant descriptions will not be repeated.

The width W2 of the third semiconductor region 151c_1 of the third switching element T3_1 (that is, the width in the second direction DR2) may be smaller than the width W1 of the second semiconductor region 151b (or the width W1 of the first semiconductor region 151a). Therefore, the channel width of the third switching element T3_1 may be smaller than the channel width of the second switching element T2_1.

As described above, the resistance ratio of the third switching element T3_1 is about ⅓ times the resistance ratio of the first switching element T1. The resistance ratio of the third switching element T3_1 may be a ratio of a channel width to a channel length. As the channel width of the third switching element T3_1 decreases, the resistance ratio of the third switching element T3_1 may be satisfied even if the channel length of the third switching element T3_1 is reduced. That is, the channel width and channel length of the third switching element T3_1 may be reduced, the layout space of the third switching element T3_1 may be reduced, and the aperture ratio of the display device 1_3 may be improved.

In some exemplary embodiments, the width WL1 of the second drain electrode 175b_1 may be 1.5 to 3 times the width of the first source electrode 173a (or the first drain electrode 175a). For example, when the width of the first source electrode 173a is about 2 μm, the width WL1 of the second drain electrode 175b_1 may be 4 μm to 6 μm, or about 5 μm.

In this case, even if the alignment between the second conductive layer 170 and the semiconductor layer 150 changes, for example, even if the second conductive layer 170 is shifted in the first direction DR1 with respect to the semiconductor layer 150, the channel width and channel length of the second switching element T2_1 and the channel width and channel length of the third switching element T3_1 may not change.

As described above, the width of the third semiconductor region 151c_1 is smaller than the width of the second semiconductor region 151b, and the width of the second drain electrode 175b_1 (or the fourth electrode line) is relatively increased, thereby uniformly maintaining the display quality and visibility of the display device 1_3 for each region and further improving the aperture ratio of the display device 1_3.

Although it is shown in FIGS. 11 and 12 that the width of the first semiconductor pattern 151_1 changes discontinuously at a portion overlapping the second drain electrode 175b_1, exemplary embodiments are not limited thereto. For example, the width of the first semiconductor pattern 151_1 may change at the center of the third semiconductor region 151c_1 (that is, the portion not overlapping the second drain electrode 175b_1), and the average width of the third semiconductor region 151c_1 may be smaller than the width of the second semiconductor region 151b. In this case, the width of the second drain electrode 175b_1 may be equal to the width of the first source electrode 173a (or the second drain electrode 175b).

Figure 13:
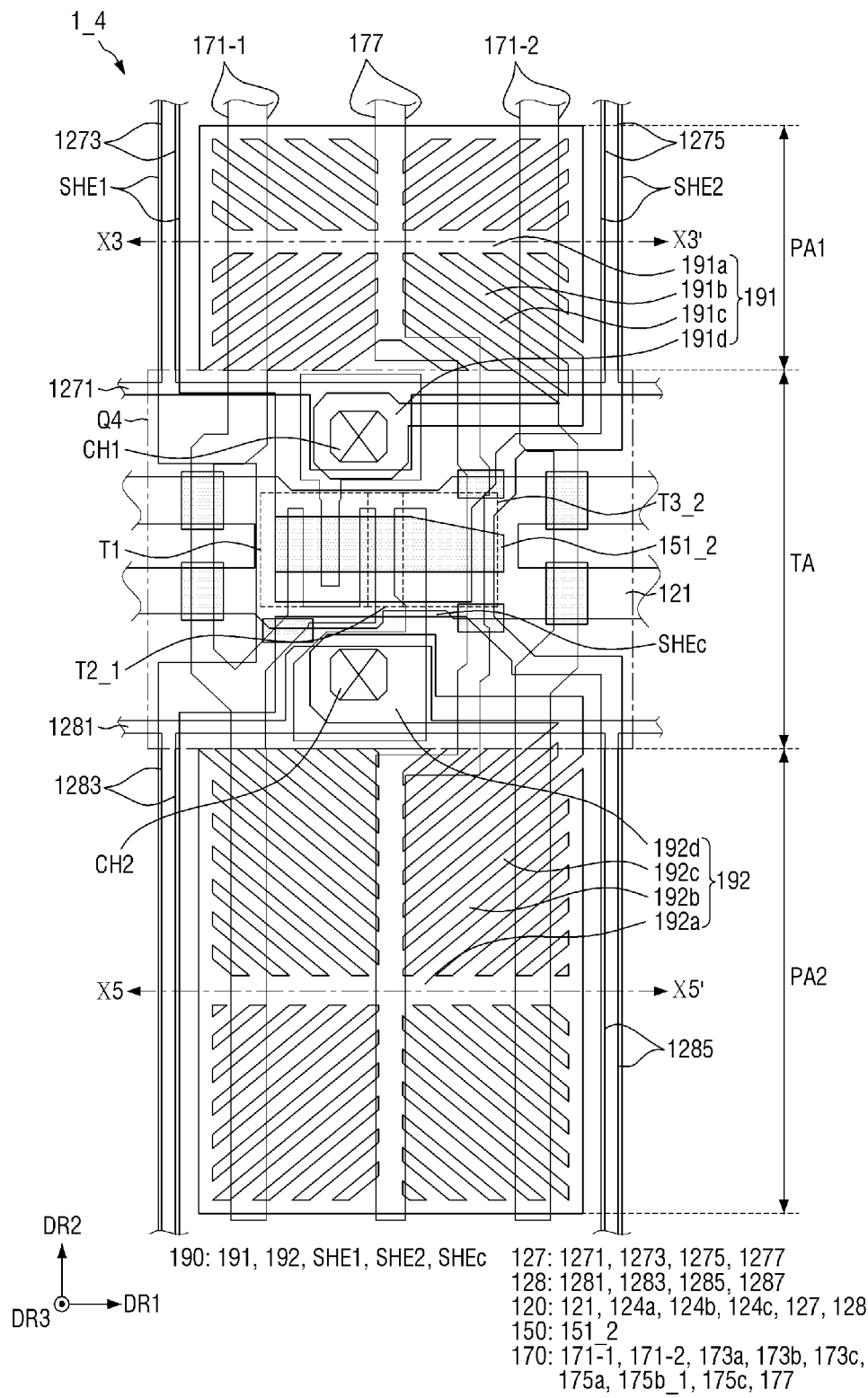
FIG. 13 is a layout view showing still another example of a pixel of the display device of FIG. 1 according to some exemplary embodiments.
Figure 14:
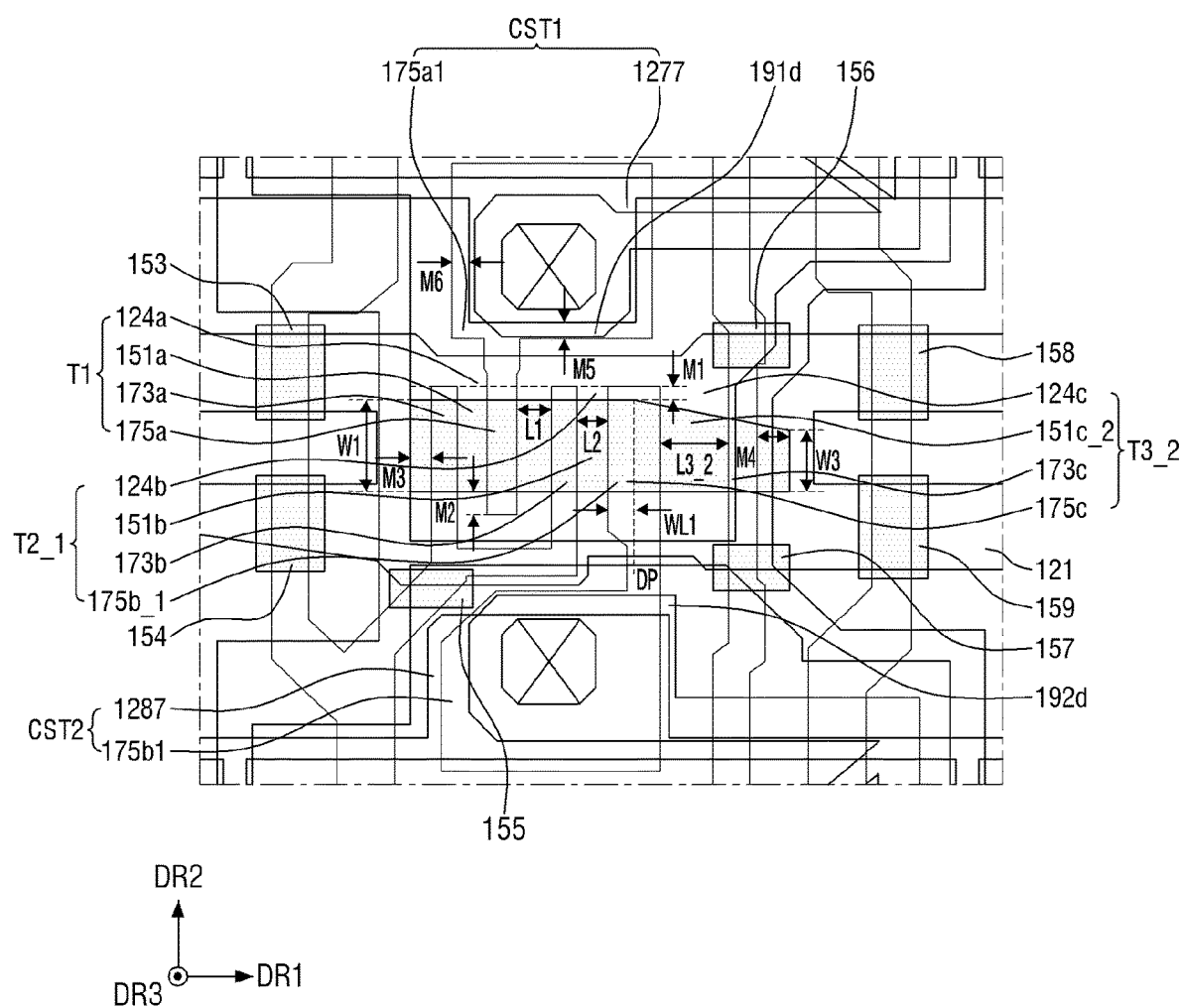
FIG. 14 is an enlarged view of the area Q4 in FIG. 13 according to some exemplary embodiments.

FIG. 13 is a layout view showing still another example of a pixel of the display device of FIG. 1 according to some exemplary embodiments. FIG. 14 is an enlarged view of the area Q4 in FIG. 13 according to some exemplary embodiments.

Referring to FIGS. 11 to 14, a display device 1_4 of FIGS. 13 and 14 is different from the display device 1_3 of FIGS. 11 and 12 in that the display device 1_4 includes a first semiconductor pattern 151_2. Accordingly, primarily differences are described below.

The first semiconductor pattern 151_2 may include a first semiconductor region 151a of a first switching element T1, a second semiconductor region 151b of a second switching element T2_1, and a third semiconductor region 151c_2 of a third switching elements T3_2.

The third semiconductor region 151c_2, similarly to the third semiconductor region 151c_1 having been described with reference to FIGS. 11 and 12, may have a width W3 (or an average width) smaller than the width W1 of the second semiconductor region 151b (or the first semiconductor region 151a).

The width W2 of the third semiconductor region 151c_1 having been described with reference to FIGS. 11 and 12 is constant along the first direction DR1, but the width W3 of the third semiconductor region 151c_2 may change along the first direction DR1. As shown in FIG. 14, the width W3 of the third semiconductor region 151c_2 may increase toward the second drain electrode 175b_1 (or the fourth electrode line), and may decrease toward the voltage division reference line 177.

Even in this case, it is possible to uniformly maintain the display quality and visibility of the display device 1_4 for each region and further improve the aperture ratio of the display device 1_4.

Although it is shown in FIGS. 13 and 14 that the width of the first semiconductor pattern 151_2 changes linearly from a portion overlapping the second drain electrode 175b_1 to a portion overlapping the voltage division reference line 177, exemplary embodiments are not limited thereto. For example, the width W3 of the first semiconductor pattern 151_2 may change only at the center of the third semiconductor region 151c_2. In this case, the width W1 of the second drain electrode 175b_1 may be equal to the width W1 of the first source electrode 173a (or the second drain electrode 175b).

Figure 15:
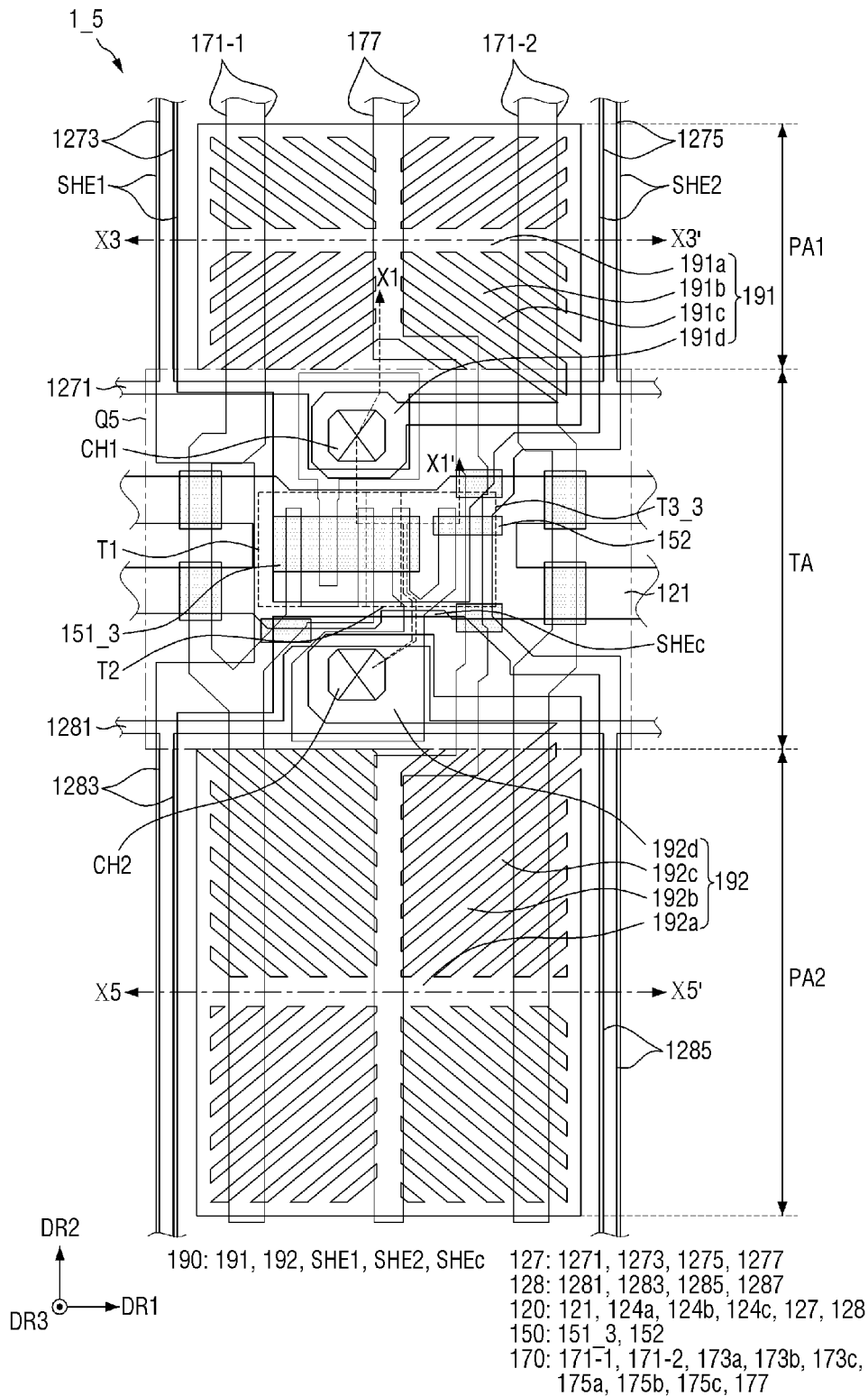
FIG. 15 is a layout view showing still another example of a pixel of the display device of FIG. 1 according to some exemplary embodiments.
Figure 16:
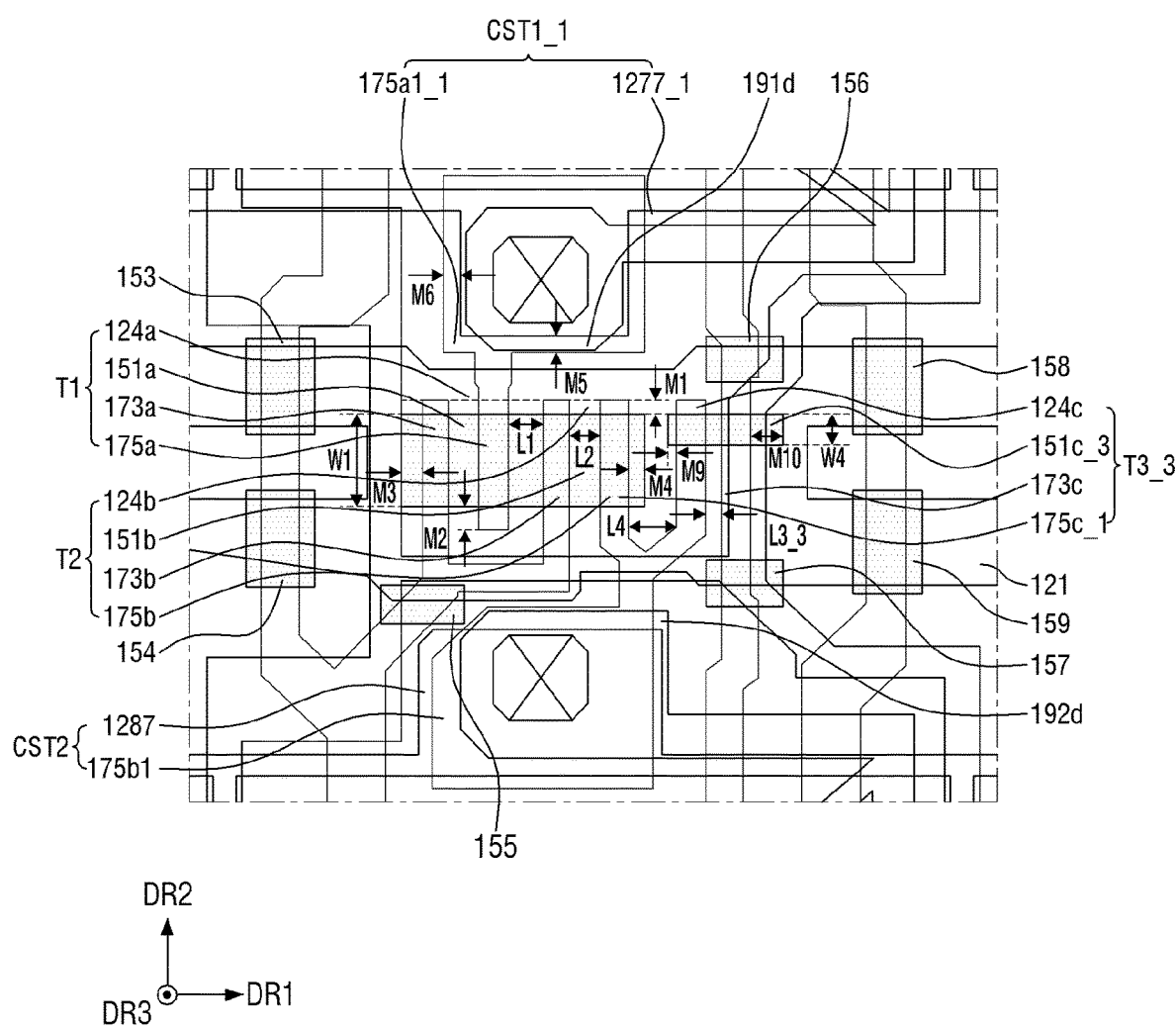
FIG. 16 is an enlarged view of the area Q5 in FIG. 15 according to some exemplary embodiments.

FIG. 15 is a layout view showing still another example of a pixel of the display device of FIG. 1 according to some exemplary embodiments. FIG. 16 is an enlarged view of the area Q5 in FIG. 15 according to some exemplary embodiments.

Referring to FIGS. 2, 3, 8, 15, and 16, a display device 1_5 is different from the display devices 1 and 1_1 of FIGS. 2, 3, and 8 in that the display device 1_5 includes a first semiconductor pattern 151_3 and further includes a second semiconductor pattern 152 and a third drain electrode 175c_1 (or a fifth electrode line and a fifth electrode pattern). Accordingly, primarily differences are described below.

The first semiconductor pattern 151_3 may include a first semiconductor region 151a for a first switching element T1 and a second semiconductor region 151b for a second switching element T2. The first semiconductor region 151a and the second semiconductor region 151b may be substantially the same as or similar to the first semiconductor region 151a and the second semiconductor region 151b described with reference to FIGS. 2 and 3.

The second semiconductor pattern 152 may be formed on (or as part of) the semiconductor layer 150, and may be disposed to be spaced apart from the first semiconductor pattern 151_3 in the first direction DR1.

The second semiconductor pattern 152 may include a third semiconductor region 151c_3, and may constitute a channel of a third switching element T3_3. The width W4 of the second semiconductor pattern 152 may be smaller than the width W1 of the first semiconductor pattern 151_3. For example, the width W4 of the second semiconductor pattern 152 may be ⅔ to ⅓ or ½ times the width W1 of the first semiconductor pattern 151_3. Meanwhile, the length L3_3 of the channel region (or the third semiconductor region 151c_3) of the second semiconductor pattern 152 may be the same as or different from the length L2 of the second semiconductor region 151b.

The third drain electrode 175c_1 may be electrically connected to the second drain electrode 175b, extend substantially in the second direction DR2, intersect the second semiconductor pattern 152, and overlap the second semiconductor pattern 152. Similarly to the second drain electrode 175b, the third drain electrode 175c_1 may extend in the second direction DR2 from the first sub-pixel area PA1 toward the second sub-pixel area PA2, and may protrude toward the outside of the second semiconductor pattern 152. The length M1 of the protrusion of the third drain electrode 175c_1 (that is, the portion protruding toward the outside of the second semiconductor pattern 152) may be equal to the length M1 of the protrusion of the second drain electrode 175b.

The third drain electrode 175c_1 may be located inward from an edge of the second semiconductor pattern 152 in the first direction DR1. That is, the second semiconductor pattern 152 may protrude from the third drain electrode 175c_1 in the first direction DR1. The length M9 of the portion of the second semiconductor pattern 152 protruding from the third drain electrode 175c_1 in the first direction DR1 may be equal to the aforementioned third length M3.

Therefore, the display quality and visibility of the display device 1_5 for each region can be uniformly maintained.

As described above, according to various exemplary embodiments, it is possible to provide a display device having uniform display quality. It is noted, however, that the effects of the inventive concepts are not limited by the foregoing, and other various effects are anticipated.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device, comprising:
a gate line;
a semiconductor pattern disposed on the gate line;
a data line insulated from the gate line, the data line intersecting the gate line;
a voltage division reference line insulated from the gate line, the voltage division reference line intersecting the semiconductor pattern;
a first source electrode electrically connected to the data line and overlapping the semiconductor pattern in a plan view;
a first drain electrode spaced apart from the first source electrode and overlapping the semiconductor pattern in the plan view,
a first gate electrode electrically connected to the gate line and overlapping the semiconductor pattern in the plan view;
a second source electrode electrically connected to the data line and overlapping the semiconductor pattern in the plan view;
a second drain electrode spaced apart from the second source electrode and overlapping the semiconductor pattern in the plan view;
a second gate electrode electrically connected to the gate line and overlapping the semiconductor pattern in the plan view;
a third source electrode electrically connected to the voltage division reference line and overlapping the semiconductor pattern in the plan view;
a third drain electrode electrically connected to the second source electrode and overlapping the semiconductor pattern in the plan view;
a third gate electrode electrically connected to the gate line and overlapping the semiconductor pattern in the plan view;
a first sub-pixel electrode electrically connected to the first drain electrode; and
a second sub-pixel electrode electrically connected to the second drain electrode,
wherein the first source electrode, the first drain electrode, the second source electrode, and the second drain electrode are arranged across the semiconductor pattern and are sequentially arranged in a first direction on the semiconductor pattern, and
wherein each of the first source electrode, the first drain electrode, the second source electrode, and the second drain electrode comprises a portion that does not overlap the semiconductor pattern in the plan view.

2. The display device of claim 1, further comprising:
a first switching element comprising the first source electrode, the first drain electrode, and the first gate electrode;
a second switching element comprising the second source electrode, the second drain electrode, and the second gate electrode; and
a third switching element comprising the third source electrode, the third drain electrode, and the third gate electrode,
wherein:
the second drain electrode and the third drain electrode are integrally formed; and
the first switching element, the second switching element, and the third switching element share the semiconductor pattern.

3. The display device of claim 1, wherein a distance between the third source electrode and the third drain electrode is different from a distance between the second source electrode and the second drain electrode.

4. The display device of claim 1, wherein:
a channel width of the third switching element is equal to a channel width of the second switching element; and
a channel length of the third switching element is longer than a channel length of the second switching element.

5. The display device of claim 4, wherein the channel length of the third switching element is 2.5 times to 3.5 times the channel length of the second switching element.

6. The display device of claim 1, wherein:
the semiconductor pattern has a uniform width in a second direction; and
the second direction is perpendicular to the first direction.

7. The display device of claim 6, wherein the first source electrode, the first drain electrode, the second source electrode, and the second drain electrode are spaced apart from each other by a same distance.

8. The display device of claim 7, further comprising:
a first switching element comprising the first source electrode, the first drain electrode, and the first gate electrode;
a second switching element comprising the second source electrode, the second drain electrode, and the second gate electrode; and
a third switching element comprising the third source electrode, the third drain electrode, and the third gate electrode,
wherein a total channel width of the first switching element is 2 times a channel width of the second switching element.

9. The display device of claim 8, wherein:
the first switching element comprises:
a first channel formed between the first source electrode and the first drain electrode, and
a second channel formed between the second source electrode and the first drain electrode; and
the total channel width of the first switching element is equal to a sum of a width of the first channel and a width of the second channel.

10. The display device of claim 1, wherein:
in the plan view, each of the first source electrode, the first drain electrode, the second source electrode, and the second drain electrode protrudes from the semiconductor pattern by a first reference length in a second direction, and protrudes from the semiconductor pattern by a second reference length in a third direction;
the second direction is perpendicular to the first direction; and
the third direction is opposite the second direction.

11. The display device of claim 10, wherein a total sum of the first reference length and the second reference length is 1.5 times to 3 times a line width of the first source electrode.

12. The display device of claim 10, wherein a total sum of the first reference length and the second reference length is 3 μm to 6 μm.

13. The display device of claim 1, wherein:
in the plan view, the semiconductor pattern protrudes from the voltage division reference line by a first reference length in the first direction;
in the plan view, the semiconductor pattern protrudes from the first source electrode by a second reference length in a second direction; and
the second direction is opposite the first direction.

14. The display device of claim 13, wherein a total sum of the first reference length and the second reference length is 1.5 times to 3 times a line width of the first reference line.

15. The display device of claim 13, wherein a total sum of the first reference length and the second reference length is 3 μm to 6 μm.

16. The display device of claim 1, further comprising:
a first sustain line spaced apart from the gate line; and
a sustain capacitor comprising:
a first electrode electrically connected to the first sustain line, and
a second electrode electrically connected to the first drain electrode,
wherein an area of the first electrode is greater than an area of the second electrode, and
wherein the second electrode overlaps the first electrode.

17. The display device of claim 1, further comprising:
a first sustain line spaced apart from the gate line; and
a sustain capacitor comprising:
a first electrode electrically connected to the first sustain line, and
a second electrode electrically connected to the first drain electrode,
wherein an area of the second electrode is greater than an area of the first electrode, and
wherein the first electrode overlaps the second electrode.

18. The display device of claim 1, further comprising:
a support semiconductor pattern disposed between the gate line and the data line in an area where the gate line and the data line intersect each other.

19. The display device of claim 1, further comprising:
a first switching element comprising the first source electrode, the first drain electrode, and the first gate electrode;
a second switching element comprising the second source electrode, the second drain electrode, and the second gate electrode; and
a third switching element comprising the third source electrode, the third drain electrode, and the third gate electrode,
wherein:
a channel width of the third switching element is smaller than a channel width of the second switching element; and
a channel length of the third switching element is longer than a channel length of the second switching element.

20. The display device of claim 19, wherein a ratio of the channel width to the channel length of the second switching element is 2.5 times to 3.5 times a ratio of the channel width to the channel length of the third switching element.

21. The display device of claim 20, wherein:
    the channel width of the second switching element is 1.5 times to 2 times the channel width of the third switching element; and
    the channel length of the third switching element is 1.5 times to 2 times the channel width of the second switching element.

22. The display device of claim 19, wherein a line width of the second drain electrode is 1.5 times to 3 times a line width of the first electrode line.

23. The display device of claim 22, wherein:
    the semiconductor pattern has a uniform width along the first direction between the second drain electrode and the voltage division reference line; and
    the uniform width is a length in a second direction perpendicular to the first direction.

24. The display device of claim 22, wherein:
    the semiconductor pattern has a variable width along the first direction between the second drain electrode and the voltage division reference line;
    the variable width of the semiconductor pattern is a variable length in a second direction perpendicular to the first direction; and
    the channel width of the third switching element corresponds to an average width of the semiconductor pattern between the second drain electrode and the voltage division reference line.

25. The display device of claim 1, wherein the semiconductor pattern has a width that linearly decreases along the first direction between the second drain electrode and the voltage division reference line.

26. A display device, comprising:
    a gate line;
    a semiconductor pattern disposed on the gate line;
    a data line insulated from the gate line, the data line intersecting the gate line;
    a voltage division reference line insulated from the gate line, the voltage division reference line intersecting the semiconductor pattern;
    a first electrode line, a second electrode line, a third electrode line, and a fourth electrode line sequentially arranged along a first direction and respectively intersect the semiconductor pattern;
    a first switching element comprising:
        a first source electrode electrically connected to the data line, the first electrode line, and the third electrode line;
        a first drain electrode electrically connected to the second electrode line; and
        a first gate electrode electrically connected to the gate line;
    a second switching element comprising:
        a second source electrode electrically connected to the data line and the third electrode line,
        a second drain electrode electrically connected to the fourth electrode line, and
        a second gate electrode electrically connected to the gate line;
    a third switching element comprising:
        a third source electrode electrically connected to the fourth electrode line,
        a third drain electrode electrically connected to the voltage division reference line, and
        a third gate electrode electrically connected to the gate line;
    a first sub-pixel electrode electrically connected to the first drain electrode; and
    a second sub-pixel electrode electrically connected to the second drain electrode,
    wherein a width of the semiconductor pattern in a second direction between the fourth electrode line and the voltage division reference line is smaller than a width of the semiconductor pattern in a second direction between the third electrode line and the fourth electrode line, and
    wherein the second direction is perpendicular to the first direction.

27. The display device of claim 26, wherein a ratio of a channel width to a channel length of the second switching element is 2.5 times to 3.5 times a ratio of a channel width to a channel length of the third switching element.

28. The display device of claim 27, wherein:
    the channel width of the second switching element is 1.5 times to 2 times the channel width of the third switching element; and
    the channel length of the third switching element is 1.5 times to 2 times the channel width of the second switching element.

29. The display device of claim 26, wherein a line width of the fourth electrode line is 1.5 times to 3 times a line width of the first electrode line.

30. The display device of claim 29, wherein:
    the semiconductor pattern has a uniform width in a second direction between the fourth electrode line and the voltage division reference line;
    the uniform width is a length in a second direction; and
    the second direction is perpendicular to the first direction.

31. The display device of claim 29, wherein:
    the semiconductor pattern has a variable width along the first direction between the fourth electrode line and the voltage division reference line;
    the variable width is a length in a second direction;
    the second direction is perpendicular to the first direction; and
    the channel width of the third switching element corresponds to an average width of the semiconductor pattern between the fourth electrode line and the voltage division reference line.

32. The display device of claim 31, wherein the variable width linearly decreases along the first direction between the fourth electrode line and the voltage division reference line.

33. A display device, comprising:
    a semiconductor pattern disposed in a pixel, the semiconductor pattern having a first width in a first direction and a second width in a second direction crossing the first direction; and
    a plurality of conductive patterns disposed along the second width of the semiconductor pattern and located on the same layer as one another, the plurality of conductive patterns traversing the semiconductor pattern in the first direction,
    wherein:
        the plurality of conductive patterns comprise a first conductive pattern, a second conductive pattern, a third conductive pattern, and a fourth conductive pattern that are sequentially arranged and spaced apart from one another in the second direction;
        the first width of the semiconductor pattern in the first direction is uniform from the second conductive pattern to the fourth conductive pattern;

the plurality of conductive patterns further comprises a fifth conductive pattern traversing the pixel in the first direction;

the first conductive pattern traverses the semiconductor pattern in the first direction from a first extension region disposed in the pixel and terminates on a first side of the semiconductor pattern;

the second conductive pattern is branched from the fifth conductive pattern and traverses the semiconductor pattern in the first direction, the second conductive pattern terminating on a second side of the semiconductor pattern;

the third conductive pattern traverses the semiconductor pattern in the first direction from a second extension region disposed in the pixel and terminates on the second side of the semiconductor pattern; and the fourth conductive pattern traverses the pixel in the first direction.

34. The display device of claim 33, further comprising:

a signal line disposed on a different layer than the plurality conductive patterns, the signal line traversing the pixel in the second direction and overlapping the semiconductor pattern.

\* \* \* \* \*